US012622017B2

(12) United States Patent
Han et al.

(10) Patent No.: US 12,622,017 B2
(45) Date of Patent: May 5, 2026

(54) SEMICONDUCTOR DEVICE WITH MULTI-LAYER CONTACT LINER STRUCTURE

(71) Applicant: SAMSUNG ELECTRONICS CO., LTD., Suwon-si (KR)

(72) Inventors: Kyu-Hee Han, Suwon-si (KR); Bong Kwan Baek, Suwon-si (KR); Jung Hwan Chun, Suwon-si (KR); Koung Min Ryu, Suwon-si (KR); Jong Min Baek, Suwon-si (KR); Jung Hoo Shin, Suwon-si (KR); Jun Hyuk Lim, Suwon-si (KR); Sang Shin Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 490 days.

(21) Appl. No.: 18/117,837

(22) Filed: Mar. 6, 2023

(65) Prior Publication Data

US 2023/0395667 A1     Dec. 7, 2023

(30) Foreign Application Priority Data

Jun. 7, 2022    (KR) ........................... 10-2022-068725

(51) Int. Cl.
H10D 30/62       (2025.01)
H10D 30/43       (2025.01)
(Continued)

(52) U.S. Cl.
CPC ......... *H10D 30/6729* (2025.01); *H10D 30/43* (2025.01); *H10D 30/6211* (2025.01); *H10D 30/6219* (2025.01); *H10D 30/6735* (2025.01);

*H10D 30/6757* (2025.01); *H10D 62/121* (2025.01); *H10D 64/258* (2025.01)

(58) Field of Classification Search
CPC .. H10D 64/258; H10D 64/256; H10D 84/834; H10D 84/853; H10D 30/62
See application file for complete search history.

(56) References Cited

U.S. PATENT DOCUMENTS 6,417,094 B1 * 7/2002 Zhao ................. H01L 21/76808
                                                           257/E21.579
9,741,812 B1 * 8/2017 Adusumilli .......... H10D 62/151
                    (Continued)

*Primary Examiner* — William B Partridge
*Assistant Examiner* — Felix B Andrews
(74) *Attorney, Agent, or Firm* — Sughrue Mion, PLLC

(57)         ABSTRACT

Provided is a semiconductor device including an active pattern extended in a first direction, a plurality of gate structures including a gate electrode and a gate spacer disposed to be spaced apart from each other in the first direction on the active pattern and extended in a second direction, a source/drain pattern on the active pattern, a source/drain contact on the source/drain pattern, and a contact liner structure extended along a sidewall of the source/drain contact, being in contact with the sidewall of the source/drain contact. The contact liner structure includes a first contact liner and a second contact liner on the first contact liner. The first contact liner includes a first bottom portion, and a first vertical portion protruded from the first bottom portion and extended in a third direction. A lower surface of the contact liner structure is higher than an upper surface of the source/drain pattern.

20 Claims, 34 Drawing Sheets

(51) Int. Cl.
    *H10D 30/67*         (2025.01)
    *H10D 62/10*         (2025.01)
    *H10D 64/23*         (2025.01)

(56)                References Cited

U.S. PATENT DOCUMENTS

| | | | |
|---|---|---|---|
| 10,283,406 B2 | 5/2019 | Basker et al. | |
| 10,727,347 B2 | 7/2020 | Huang et al. | |
| 11,011,617 B2 | 5/2021 | Lee et al. | |
| 11,114,544 B2 | 9/2021 | Kwak et al. | |
| 11,121,236 B2 | 9/2021 | Wu et al. | |
| 2007/0001233 A1* | 1/2007 | Schwan | H10D 30/0275 |
| | | | 257/369 |
| 2015/0194342 A1* | 7/2015 | Cao | H01L 23/5329 |
| | | | 438/786 |
| 2017/0154968 A1* | 6/2017 | Park | H10D 30/797 |
| 2020/0035549 A1* | 1/2020 | Wu | H01L 21/76832 |
| 2021/0066453 A1* | 3/2021 | Lee | H10D 30/6219 |
| 2021/0066500 A1 | 3/2021 | Liu et al. | |
| 2022/0052169 A1 | 2/2022 | More et al. | |

\* cited by examiner

SEMICONDUCTOR DEVICE WITH MULTI-LAYER CONTACT LINER STRUCTURE

CROSS-REFERENCE TO RELATED APPLICATION

This application is based on and claims priority under 35 U.S.C. § 119 to Korean Patent Application No. 10-2022-0068725, filed on Jun. 7, 2022, in the Korean Intellectual Property Office, the disclosure of which is incorporated by reference herein in its entirety.

BACKGROUND

1. Field

The disclosure relates to a semiconductor device.

2. Description of Related Art

A scaling technique for increasing a density of a semiconductor device includes a multi-gate transistor for forming a multi-channel active pattern (or silicon body) of a fin or nano-wire shape on a substrate, and forming a gate on a surface of the multi-channel active pattern.

As a pitch size of a semiconductor device is reduced, there is a need for reducing capacitance and ensuring electrical stability between contacts in the semiconductor device.

SUMMARY

Various embodiments of the present disclosure provide for a semiconductor device capable of improving device performance and reliability.

According to an aspect of the present disclosure, a semiconductor device includes an active pattern extended in a first direction, a plurality of gate structures including a gate electrode and a gate spacer, which are disposed to be spaced apart from each other in the first direction on the active pattern and extended in a second direction, a source/drain pattern on the active pattern, a source/drain contact on the source/drain pattern, and a contact liner structure extended along a sidewall of the source/drain contact, being in contact with the sidewall of the source/drain contact. The contact liner structure includes a first contact liner and a second contact liner on the first contact liner. The first contact liner includes a first bottom portion, and a first vertical portion protruded from the first bottom portion and extended in a third direction. A lower surface of the contact liner structure is higher than an upper surface of the source/drain pattern.

According to an aspect of the present disclosure, a semiconductor device includes an active pattern extended in a first direction, a plurality of gate structures including a gate electrode and a gate spacer, which are disposed to be spaced apart from each other in the first direction on the active pattern and extended in a second direction, and a gate capping layer on the gate electrode and the gate spacer, a source/drain pattern on the active pattern, an etch stop layer extended along a sidewall of the plurality of gate structures and an upper surface of the source/drain pattern, a source/drain contact on the source/drain pattern, and a contact liner structure extended along a sidewall of the source/drain contact on the etch stop layer. The contact liner structure includes a first contact liner, and a second contact liner extended along the first contact liner and disposed between the first contact liner and the source/drain contact. The etch stop layer is in contact with a sidewall of the first contact liner at a first height in a third direction perpendicular to the first direction and the second direction. An interlayer insulating layer is disposed between the etch stop layer and the sidewall of the first contact liner at a second height lower than the first height.

According to an aspect of the present disclosure, a semiconductor device includes an active pattern including a lower pattern extended in a first direction and a plurality of sheet patterns spaced apart from the lower pattern in a second direction perpendicular to the first direction, a plurality of gate structures including a gate electrode and a gate spacer, which are disposed to be spaced apart from each other in the first direction on the active pattern and extended in a third direction crossing the first direction and the second direction, a source/drain pattern on the active pattern, a source/drain contact on the source/drain pattern, an etch stop layer extended along a sidewall of the plurality of gate structures and an upper surface of the source/drain pattern, and a contact liner structure extended along a sidewall of the source/drain contact on the etch stop layer. The contact liner structure includes a first contact liner and a second contact liner on the first contact liner. The first contact liner includes a first bottom portion, and a first vertical portion protruded from the first bottom portion and extended in the second direction. The etch stop layer is in contact with the first vertical portion at a first height in the second direction. An interlayer insulating layer is disposed between the etch stop layer and the first vertical portion at a second height lower than the first height.

The aspects of the present disclosure are not limited to those mentioned above and additional aspects of the present disclosure, which are not mentioned herein, will be clearly understood by those skilled in the art from the following description.

BRIEF DESCRIPTION OF DRAWINGS

The above and other aspects and features of the present disclosure will become more apparent by describing in detail exemplary embodiments thereof with reference to the attached drawings, in which.

DETAILED DESCRIPTION

The embodiments described herein are example embodiments, and thus, the disclosure is not limited thereto and may be realized in various other forms. Each of the embodiments provided in the above description is not excluded from being associated with one or more features of another example or another embodiment also provided herein or not provided herein but consistent with the disclosure. For example, even if matters described in a specific example or embodiment are not described in a different example or embodiment, the matters may be understood as being related to or combinable with the different example or embodiment, unless otherwise mentioned in descriptions thereof.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

A semiconductor device according to various embodiments includes, but is not limited to, a fin-type transistor (FinFET) including a channel region of a fin-type pattern shape, a transistor including a nano-wire or a nano-sheet, a multi-bridge channel field effect transistor (MBCFET) or a vertical transistor (FET) by way of example. The semiconductor device according to various embodiments may include a tunneling transistor (tunneling FET) or a three-dimensional (3D) transistor. The semiconductor device according to various embodiments may include a planar transistor. In addition, aspects of the present disclosure may be applied to two-dimensional (2D) material based transistors (FETs) and a heterogeneous structure thereof.

In addition, the semiconductor device according to various embodiments may include a bipolar junction transistor, a lateral double diffusion transistor (LDMOS), and the like.

Figure 1:
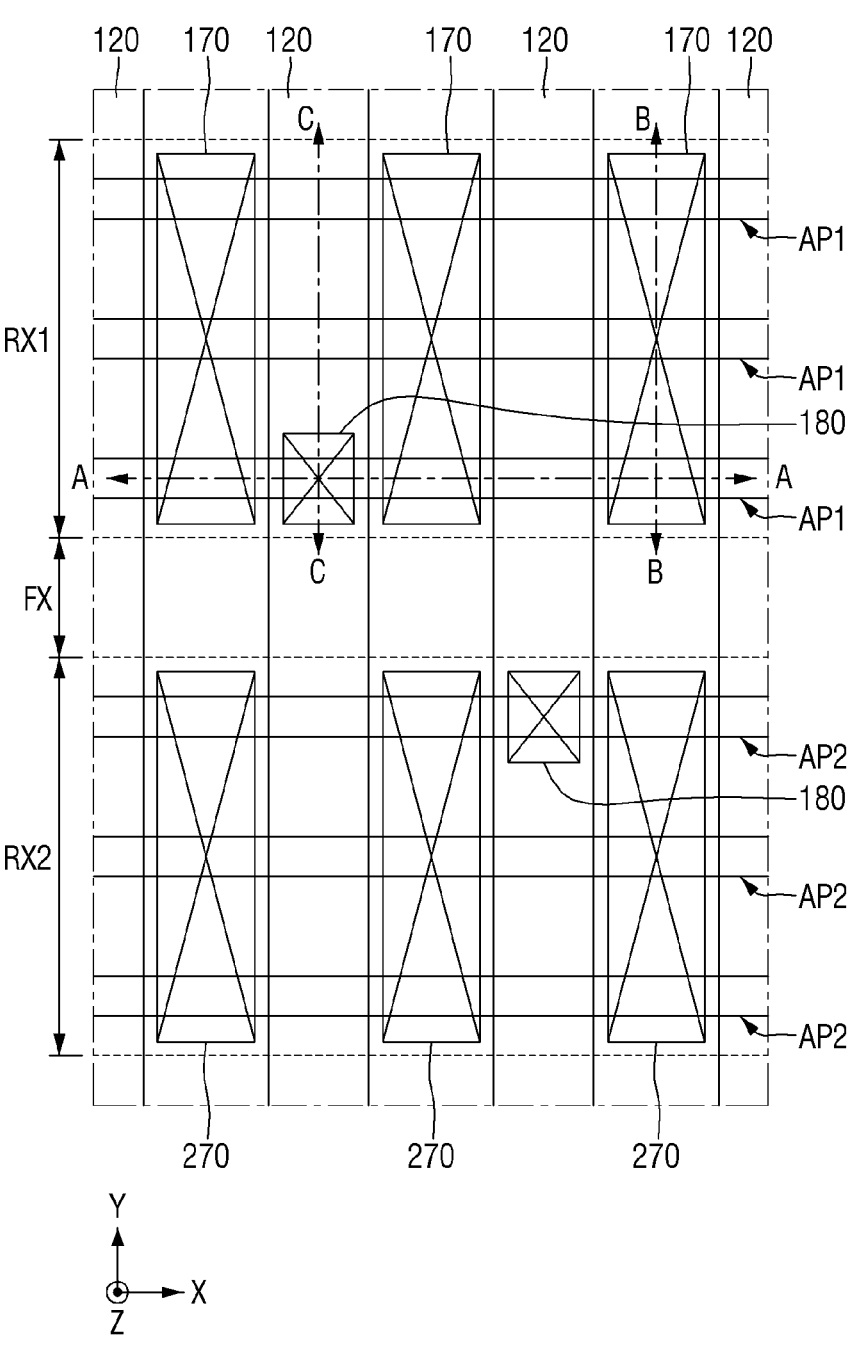
FIG. 1 is a layout view illustrating a semiconductor device, according to various embodiments.
Figure 2:
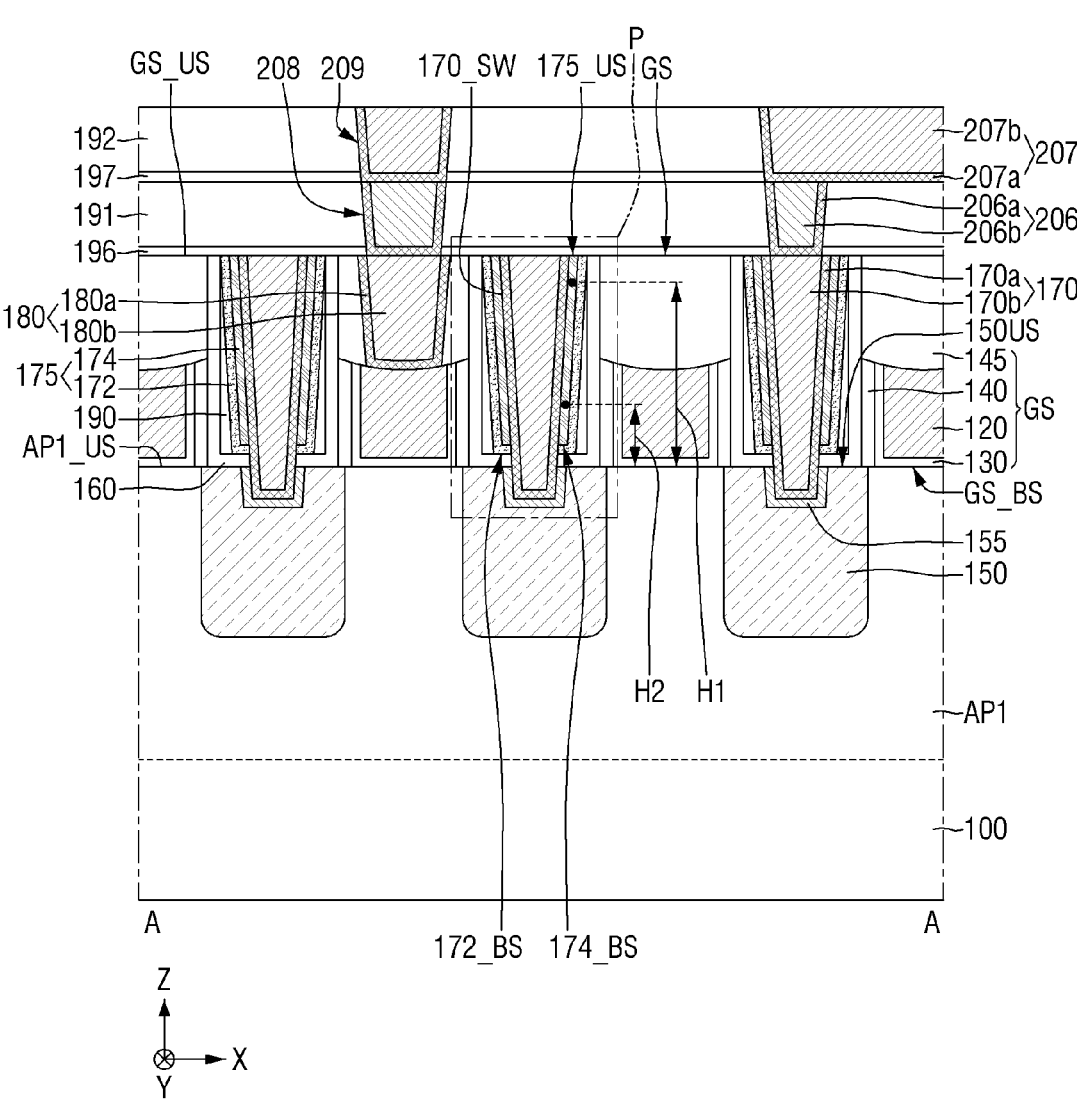
FIG. 2 is a cross-sectional view taken along line A-A of FIG. 1, according to various embodiments.
Figure 3:
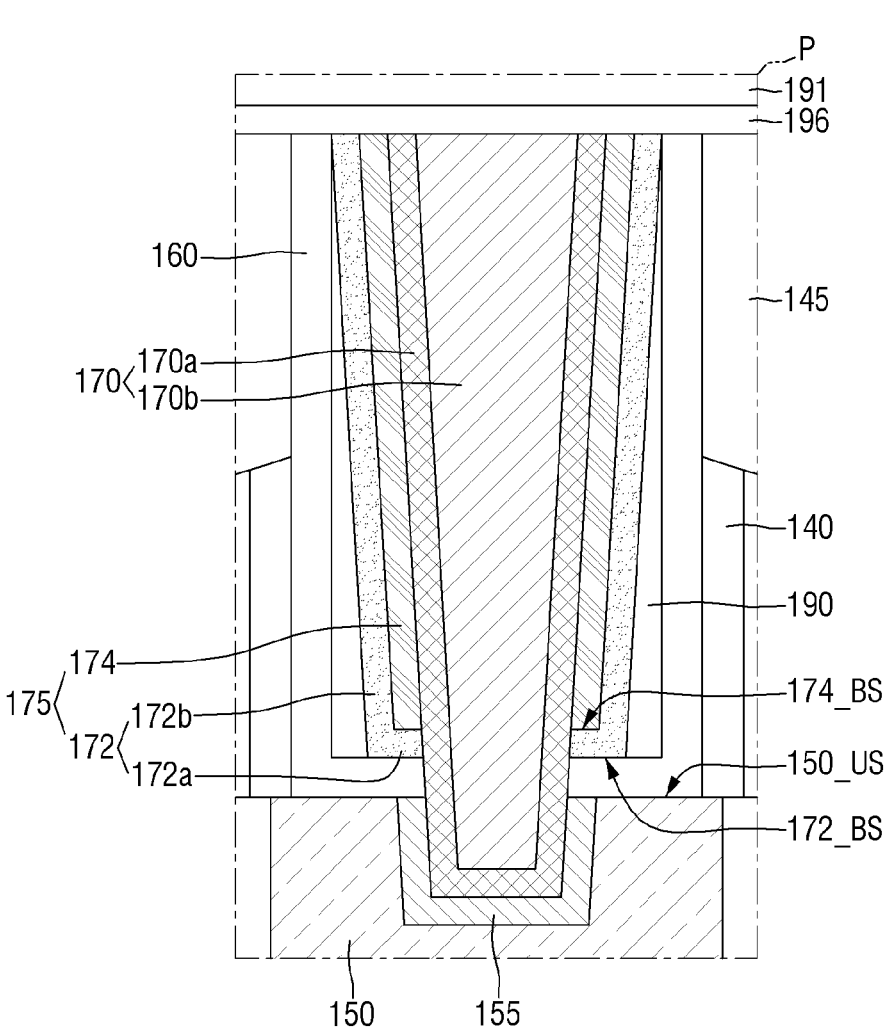
FIG. 3 is an enlarged view illustrating a portion P of FIG. 2, according to various embodiments.
Figure 4:
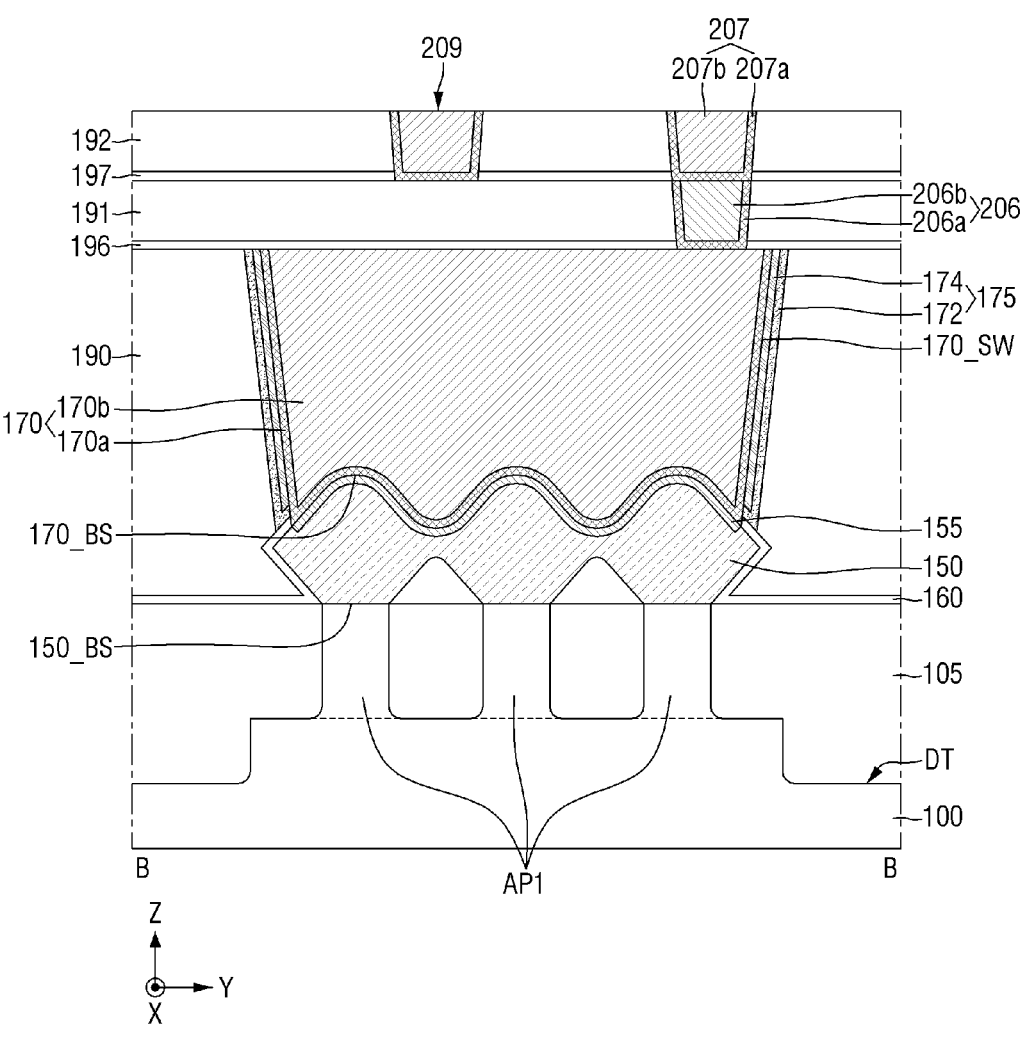
FIG. 4 is a cross-sectional view taken along line B-B of FIG. 1, according to various embodiments.
Figure 5:
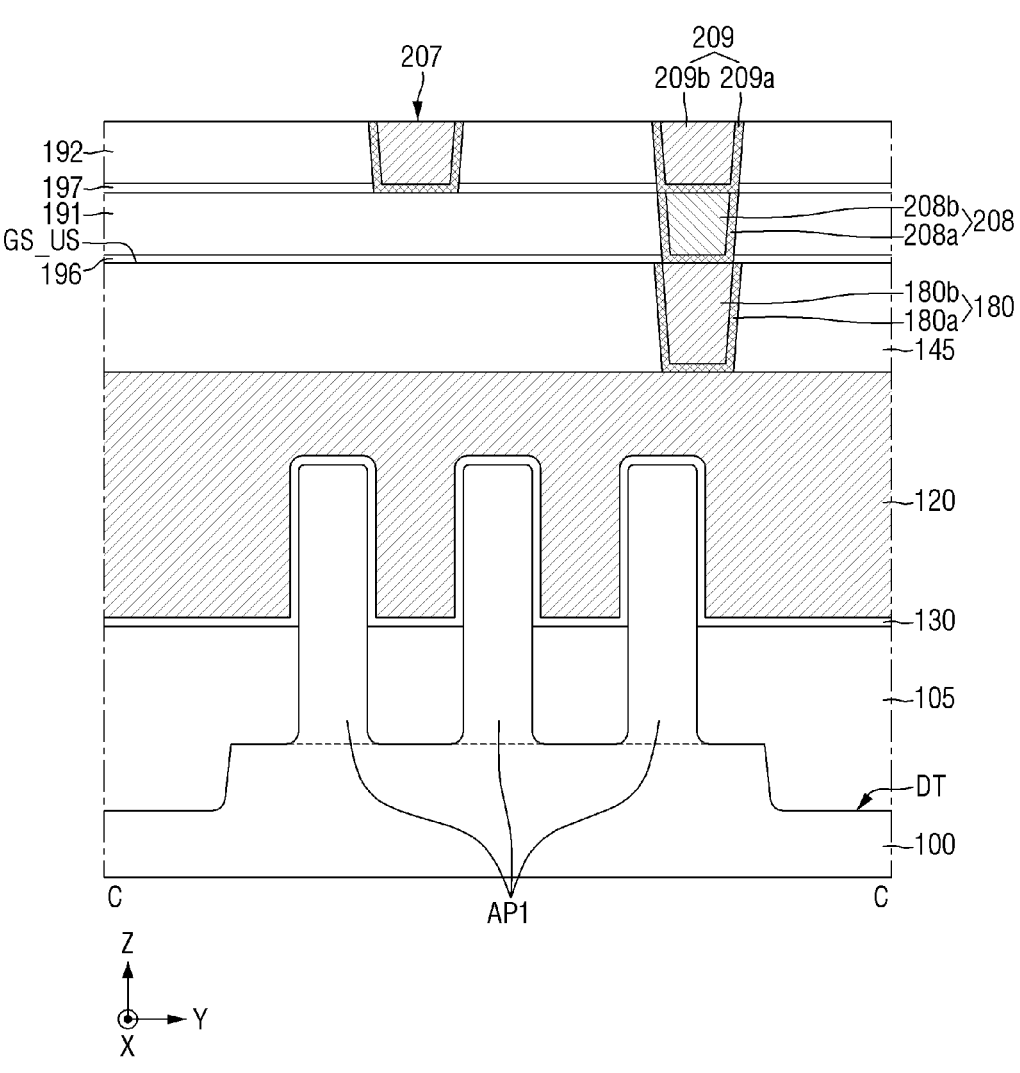
FIG. 5 is a cross-sectional view taken along line C-C of FIG. 1, according to various embodiments.

FIG. 1 is a layout view illustrating a semiconductor device, according to various embodiments. FIG. 2 is a cross-sectional view taken along line A-A of FIG. 1, according to various embodiments. FIG. 3 is an enlarged view illustrating a portion P of FIG. 2, according to various embodiments. FIG. 4 is a cross-sectional view taken along line B-B of FIG. 1, according to various embodiments. FIG. 5 is a cross-sectional view taken along line C-C of FIG. 1, according to various embodiments.

Referring to FIG. 2, a first via plug 206 connected to a first source/drain contact 170 and a second via plug 208 connected to a gate contact 180 are shown as being disposed to be adjacent on at least one first active pattern AP1 in a first direction X. The arrangement of the first via plug 206 and second via plug 208 is for convenience of description, but is not limited thereto.

The cross-sectional view taken along the at least one second active pattern AP2 in the first direction X may be similar to that of FIG. 2 except for positions of the first via plug 206, the second via plug 208, a first wiring line 207, and a second wiring line 209.

Referring to FIGS. 1-5, the semiconductor device may include at least one first active pattern AP1, at least one second active pattern AP2, at least one gate electrode 120, a first source/drain contact 170, a second source/drain contact 270, and a gate contact 180.

The substrate 100 may include a first active area RX1, a second active area RX2, and a field area FX. The field area FX may be formed directly to be adjacent to the first active area RX1 and the second active area RX2. The field area FX may form a boundary with the first active area RX1 and the second active area RX2.

The first active area RX1 and the second active area RX2 are spaced apart from each other. The first active area RX1 and the second active area RX2 may be separated by the field area FX.

In other words, an element isolation layer may be disposed around the first active area RX1 and the second active area RX2, which are spaced apart from each other. In this case, a portion of the element isolation layer between the first active area RX1 and the second active area RX2 may be the field area FX. For example, a portion where a channel area of a transistor, which may be an example of a semiconductor device, is formed may be an active area, and a portion for distinguishing a channel area of the transistor formed in the active area may be a field area. Alternatively, the active area may be an area in which a fin-type pattern or nano-sheet used as a channel area of the transistor is formed, and the field area may be an area in which a fin-type pattern or nano-sheet used as a channel area of the transistor is not formed.

As shown in FIGS. 4 and 5, the field area FX may be defined by a deep trench DT, but is not limited thereto. In addition, it is apparent that those skilled in the art to which the present disclosure pertains may distinguish which portion is a field area and which portion is an active area.

For example, one of the first and second active areas RX1 and RX2 may be a PMOS transistor forming area, and the other one thereof may be an NMOS transistor forming area. For another example, the first active area RX1 and the second active area RX2 may be PMOS transistor forming areas. For another example, the first active area RX1 and the second active area RX2 may be NMOS transistor forming areas.

The substrate 100 may be a silicon substrate or a silicon-on-insulator (SOI). Otherwise, the substrate 100 may include silicon germanium, silicon germanium on insulator (SGOI), indium antimonide, lead telluride compound, indium arsenide, indium phosphide, gallium arsenide or gallium antimonide, but is not limited thereto.

The at least one first active pattern AP1 may be formed in the first active area RX1. The at least one first active pattern AP1 may be protruded from the substrate 100 of the first active area RX1. The at least one first active pattern AP1 may be extended along the first direction X on the substrate 100. For example, the at least one first active pattern AP1 may include a long side extended in the first direction X and a short side extended in a second direction Y. In this case, the first direction X may cross the second direction Y and a third direction Z. In addition, the second direction Y may cross the third direction Z. The third direction Z may be a thickness direction of the substrate 100.

The at least one second active pattern AP2 may be formed in the second active area RX2. The description of the at least one second active pattern AP2 may be substantially the same as that of the at least one first active pattern AP1.

The at least one first active pattern AP1 and the at least one second active pattern AP2 may be multi-channel active patterns, respectively. In the semiconductor device according to various embodiments, each of the at least one first active pattern AP1 and the at least one second active pattern AP2 may be, for example, a fin-type pattern. Each of the at least one first active pattern AP1 and the at least one second active pattern AP2 may be used as a channel area of a transistor. Although three first active patterns AP1 and three second active patterns AP2 are shown, it is for convenience of description, and the present disclosure is not limited thereto. The at least one first active pattern AP1 and the at least one second active pattern AP2 may be one or more, respectively.

Each of the at least one first active pattern AP1 and the at least one second active pattern AP2 may be a portion of the substrate 100, and may include an epitaxial layer grown from the substrate 100. Each of the at least one first active pattern AP1 and the at least one second active pattern AP2 may include silicon or germanium, which is an elemental semiconductor material. Each of the at least one first active pattern AP1 and the at least one second active pattern AP2 may include a compound semiconductor, and may include, for example, a group IV-IV compound semiconductor or a group III-V compound semiconductor.

The group IV-IV compound semiconductor may be a binary compound or ternary compound, which includes at least two of carbon (C), silicon (Si), germanium (Ge) or tin (Sn), or a compound including at least two of carbon (C), silicon (Si), germanium (Ge) or tin (Sn), which are doped with a group IV element.

The group III-V compound semiconductor may be, for example, one of a binary compound, a ternary compound or a quaternary compound, which is formed by combination of at least one of aluminum (Al), gallium (Ga) and indium (In), which is a group III element, and one of phosphorus (P), arsenic (As) and antimony (Sb), which are group V elements.

For example, the at least one first active pattern AP1 and the at least one second active pattern AP2 may include the same material. For example, each of the at least one first active pattern AP1 and the at least one second active pattern AP2 may be a silicon fin-type pattern. Alternatively, for example, each of the at least one first active pattern AP1 and the at least one second active pattern AP2 may be a fin-type pattern that includes a silicon-germanium pattern. As another example, the at least one first active pattern AP1 and the at least one second active pattern AP2 may include their respective materials different from each other. For example, the at least one first active pattern AP1 may be a silicon fin-type pattern, and the at least one second active pattern AP2 may be a fin-type pattern that includes a silicon-germanium pattern.

A field insulating layer 105 may be formed on the substrate 100. The field insulating layer 105 may be formed over the first active area RX1, the second active area RX2, and the field area FX. The field insulating layer 105 may fill a deep trench DT.

The field insulating layer 105 may cover a sidewall of the at least one first active pattern AP1 and a sidewall of the at least one second active pattern AP2. Each of the at least one first active pattern AP1 and the at least one second active pattern AP2 may be protruded above an upper surface of the field insulating layer 105. The field insulating layer 105 may include, for example, an oxide layer, a nitride layer, an oxynitride layer, or a combination layer thereof.

At least one gate structure GS may be disposed on the substrate 100. For example, the at least one gate structure GS may be disposed on the field insulating layer 105. The gate structure GS may be extended in the second direction Y. Adjacent gate structures GS may be spaced apart each other in the first direction X.

The gate structure GS may be disposed on the at least one first active pattern AP1 and the at least one second active pattern AP2. The gate structure GS may cross the at least one first active pattern AP1 and the at least one second active pattern AP2.

The gate structure GS is shown as being disposed over the first active area RX1 and the second active area RX2, it is for convenience of description, and the present disclosure is not limited thereto. That is, a portion of the gate structures GS may be separated into two parts by a gate isolation structure disposed on the field insulating layer 105, and then may be disposed on the first active area RX1 and the second active area RX2.

For example, the gate structure GS may include a gate electrode 120, a first gate insulating layer 130, a gate spacer 140, and a gate capping layer 145.

The gate electrode 120 may be disposed on the at least one first active pattern AP1 and the at least one second active pattern AP2. The gate electrode 120 may cross the at least one first active pattern AP1 and the at least one second active pattern AP2. The gate electrode 120 may surround the at least one first active pattern AP1 and the at least one second active pattern AP2, which are protruded above the upper surface of the field insulating layer 105. The gate electrode 120 may include a long side extended in the second direction Y and a short side extended in the first direction X.

An upper surface of the gate electrode 120 may be a concave curved surface that is recessed toward an upper surface of the at least one first active pattern AP1, but is not limited thereto. That is, in various embodiments, the upper surface of the gate electrode 120 may be a flat plane.

The gate electrode 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (Ta-TiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and their combination.

The gate electrode 120 may include a conductive metal oxide, a conductive metal oxynitride, and the like, and may include oxidized forms of the aforementioned materials.

The gate electrode 120 may be disposed on both sides of a source/drain pattern 150 that will be described later. The gate structure GS may be disposed on both sides of the source/drain pattern 150 in the first direction X.

For example, the at least one gate electrode 120 disposed on both sides of the source/drain pattern 150 may be normal gate electrodes used as gates of the transistor. For another example, the gate electrode 120 disposed on one side of the source/drain pattern 150 is used as a gate of the transistor, but the gate electrode 120 disposed on the other side of the source/drain pattern 150 may be a dummy gate electrode.

The gate spacer 140 may be disposed on a sidewall of the gate electrode 120. The gate spacer 140 may be extended in the second direction Y. The gate spacer 140 may include, for example, at least one of silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC) and their combination.

The first gate insulating layer 130 may be extended along a sidewall and a bottom surface of the gate electrode 120.

The first gate insulating layer 130 may be formed on the at least one first active pattern AP1, the at least one second active pattern AP2, and the field insulating layer 105. The first gate insulating layer 130 may be formed between the gate electrode 120 and the gate spacer 140.

The first gate insulating layer 130 may be formed along the profile of the at least one first active pattern AP1 protruded above the field insulating layer 105 and the upper surface of the field insulating layer 105. The first gate insulating layer 130 may be formed along the profile of the at least one second active pattern AP2 protruded above the field insulating layer 105.

The first gate insulating layer 130 may include silicon oxide, silicon oxynitride, silicon nitride, or a high dielectric constant material having a dielectric constant greater than that of silicon oxide. The high dielectric constant material may include one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

Although the first gate insulating layer 130 is shown as a single layer, it is only exemplary for convenience of description and is not limited thereto. The first gate insulating layer 130 may include a plurality of layers. For example, the first gate insulating layer 130 may include an interfacial layer disposed between the at least one first active pattern AP1 and the gate electrode 120 and between the at least one second active pattern AP2 and the gate electrode 120, and a high dielectric constant insulating layer. For example, the interfacial layer may be formed along the profile of the at least one first active pattern AP1 and the profile of the at least one second active pattern AP2, which are protruded above the field insulating layer 105.

The semiconductor device according to various embodiments may include a negative capacitance (NC) FET based on a negative capacitor. For example, the first gate insulating layer 130 may include a ferroelectric material layer having ferroelectric characteristics, and a paraelectric material layer having paraelectric characteristics.

The ferroelectric material layer may have a negative capacitance, and the paraelectric material layer may have a positive capacitance. For example, when two or more capacitors are connected in series, and the capacitance of each capacitor has a positive value, the total capacitance is more reduced than the capacitance of each individual capacitor. On the other hand, when at least one of capacitances of two or more capacitors connected in series has a negative value, the total capacitance may have a positive value and may be greater than an absolute value of each individual capacitance.

When a ferroelectric material layer having a negative capacitance and a paraelectric material layer having a positive capacitance are connected in series, the total capacitance value of the ferroelectric material layer and the paraelectric material layer connected in series may be increased. Based on the total capacitance value that is increased, a transistor having a ferroelectric material layer may have a subthreshold swing (SS) less than mV/decade at a room temperature.

The ferroelectric material layer may have ferroelectric characteristics. The ferroelectric material layer may include at least one of, for example, hafnium oxide, hafnium zirconium oxide, barium strontium titanium oxide, barium titanium oxide, or lead zirconium titanium oxide. In this case, for example, hafnium zirconium oxide may be a material doped with zirconium (Zr) in hafnium oxide. For another example, hafnium zirconium oxide may be a compound of hafnium (Hf) and zirconium (Zr) and oxygen (O).

The ferroelectric material layer may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). A type of the dopant included in the ferroelectric material layer may be varied depending on the ferroelectric material of the ferroelectric material layer.

When the ferroelectric material layer includes hafnium oxide, the dopant included in the ferroelectric material layer may include at least one of gadolinium (Gd), silicon (Si), zirconium (Zr), aluminum (Al), and yttrium (Y).

When the dopant is aluminum (Al), the ferroelectric material layer may include aluminum of 3 at % to 8 at % (atomic %). In this case, a ratio of the dopant may be a ratio of aluminum to a sum of hafnium and aluminum.

When the dopant is silicon (Si), the ferroelectric material layer may include silicon of 2 at % to 10 at %. When the dopant is yttrium (Y), the ferroelectric material layer may include yttrium of 2 at % to 10 at %. When the dopant is gadolinium (Gd), the ferroelectric material layer may include gadolinium of 1 at % to 7 at %. When the dopant is zirconium (Zr), the ferroelectric material layer may include zirconium of 50 at % to 80 at %.

The paraelectric material layer may have paraelectric characteristics. The paraelectric material layer may include, for example, at least one of silicon oxide and metal oxide having a high dielectric constant. The metal oxide included in the paraelectric material layer may include, but is not limited to, at least one of hafnium oxide, zirconium oxide, and aluminum oxide.

The ferroelectric material layer and the paraelectric material layer may include the same material. Although the ferroelectric material layer has ferroelectric characteristics, the paraelectric material layer may not have ferroelectric characteristics. For example, when the ferroelectric material layer and the paraelectric material layer include hafnium oxide, a crystal structure of hafnium oxide included in the ferroelectric material layer is different from that of hafnium oxide included in the paraelectric material layer.

The ferroelectric material layer may have a thickness having ferroelectric characteristics. The thickness of the ferroelectric material layer may be, for example, 0.5 nm to 10 nm, but is not limited thereto. Since a threshold thickness indicating ferroelectric characteristics may be varied depending on each ferroelectric material, the thickness of the ferroelectric material layer may be varied depending on the ferroelectric material.

For example, each of the gate insulating layers (first gate insulating layer 130, second gate insulating layer 230, third gate insulating layer 330 and fourth gate insulating layer 430) may include one ferroelectric material layer. For another example, each of the gate insulating layers (first gate insulating layer 130, second gate insulating layer 230, third gate insulating layer 330 and fourth gate insulating layer 430) may include a plurality of ferroelectric material layers spaced apart from each other. Each of the gate insulating layers (first gate insulating layer 130, second gate insulating layer 230, third gate insulating layer 330 and fourth gate insulating layer 430) may have a deposited layer structure in which a plurality of ferroelectric material layers and a plurality of paraelectric material layers are alternately deposited.

The gate capping layer 145 may be disposed on the upper surface of the gate electrode 120 and an upper surface of the gate spacer 140. An upper surface of the gate capping layer 145 may be an upper surface GS_US of the gate structure. The gate capping layer 145 may include, for example, at least one of silicon nitride (SiN), silicon oxynitride (SiON), silicon oxide (SiO₂), silicon carbonitride (SiCN), silicon oxycarbonitride (SiOCN), and their combination.

In various embodiments, the gate capping layer 145 may be disposed between the gate spacer 140. In this case, the upper surface of the gate capping layer 145 may be coplanar with the upper surface of the gate spacer 140. In this case, the upper surface GS_US of the gate structure may include the upper surface of the gate capping layer 145 and the upper surface of the gate spacer 140.

The source/drain pattern 150 may be disposed on the substrate 100. The source/drain pattern 150 may be formed on the at least one first active pattern AP1. The source/drain pattern 150 is connected to the at least one first active pattern AP1. A bottom surface 150_BS of the first source/drain pattern is in contact with the at least one first active pattern AP1.

The source/drain pattern 150 may be disposed on a side of the gate structure GS. The source/drain pattern 150 may be disposed between the gate structures GS.

For example, the source/drain pattern 150 may be disposed on both sides of the gate structure GS. In various embodiments, the source/drain pattern 150 may be disposed on one side of the gate structure GS, and may not be disposed on the other side of the gate structure GS.

The source/drain pattern 150 may include an epitaxial pattern. The source/drain pattern 150 may include a semiconductor material. The source/drain pattern 150 may be included in a source/drain of a transistor, which uses the at least one first active pattern AP1 as a channel area.

The source/drain pattern 150 may be connected to a channel area of the at least one first active pattern AP1, which is used as a channel. Although the source/drain pattern 150 is shown that three epitaxial patterns formed on each of the first active patterns AP1 are merged, it is merely for convenience of description and is not limited thereto. That is, the epitaxial pattern formed on each of the first active patterns AP1 may be separated from another epitaxial pattern.

For example, an air gap may be disposed in a space between the source/drain pattern 150 combined with the field insulating layer 105. As another example, an insulating material may be filled in the space between the source/drain pattern 150 combined with the field insulating layer 105.

The same source/drain pattern as described above may be disposed on the at least one second active pattern AP2 between the gate structures GS.

A source/drain etch stop layer 160 may be extended along the upper surface of the field insulating layer 105, a sidewall of the gate structure GS, and the profile of the source/drain pattern 150. The source/drain etch stop layer 160 may be disposed on an upper surface of the source/drain pattern 150 and a sidewall of the source/drain pattern 150.

The source/drain etch stop layer 160 may include a material having an etch selectivity with respect to a first interlayer insulating layer 190 that will be described later. The source/drain etch stop layer 160 may include, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), and their combination.

The first interlayer insulating layer 190 is disposed on the source/drain etch stop layer 160. The first interlayer insulating layer 190 may be formed on the field insulating layer 105. The first interlayer insulating layer 190 may be disposed on the source/drain pattern 150. The first interlayer insulating layer 190 may be disposed between the source/drain etch stop layer 160 and a contact liner structure 175.

The first interlayer insulating layer 190 may not cover the upper surface GS_US of the gate structure. For example, an upper surface of the first interlayer insulating layer 190 may be coplanar with the upper surface GS_US of the gate structure.

The first interlayer insulating layer 190 may include, for example, at least one of silicon oxide, silicon nitride, silicon oxynitride, or a low dielectric constant material. For example, the low dielectric constant material may include, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyley-CloTetraSiloxane (OMCTS), HexaMethylDiSiloxane (HMDS), TriMethylSilyl Borate (TMSB), DiAcetoxyDiter-tiaryButoSiloxane (DADBS), TriMethylSilil Phosphate (TMSP), PolyTetraFluoroEthylene (PTFE), Tonen SilaZen (TOSZ), Fluoride Silicate Glass (FSG), polyimide nano-foams such as polypropylene oxide, Carbon Doped silicon Oxide (CDO), Organo Silicate Glass (OSG), SiLK, Amorphous Fluorinated Carbon, silica aerogels, silica xerogels, mesoporous silica and their combination, but is not limited thereto.

The first source/drain contact 170 may be disposed on the first active area RX1. The second source/drain contact 270 may be disposed on the second active area RX2. The first source/drain contact 170 may be connected to the source/drain pattern 150 formed in the first active area RX1. The second source/drain contact 270 may be connected to the source/drain pattern formed in the second active area RX2.

In various embodiments, a portion of the first source/drain contact 170 may be directly connected to a portion of the second source/drain contact 270. That is, in the semiconductor device according to various embodiments, at least one source/drain contact may be disposed over the first active area RX1 and the second active area RX2.

Since details of the second source/drain contact 270 are substantially the same as those of the first source/drain contact 170, the following description will be made with reference to the first source/drain contact 170 on the at least one first active pattern AP1.

The gate contact 180 may be disposed within the gate structure GS. The gate contact 180 may be connected to the gate electrode 120 included in the gate structure GS. The gate contact 180 may be disposed at a position overlapped with the gate structure GS. In the semiconductor device according to various embodiments, at least a portion of the gate contact 180 may be disposed at a position overlapped with at least one of the first active area RX1 and the second active area RX2. For example, in a plan view, the gate contact 180 may be disposed entirely at a position overlapped with the first active area RX1 or the second active area RX2.

The first source/drain contact 170 may be connected to the source/drain pattern 150 through the source/drain etch stop layer 160. The first source/drain contact 170 may be disposed on the source/drain pattern 150.

The first source/drain contact 170 may be disposed in the first interlayer insulating layer 190. The first source/drain contact 170 may be surrounded by the first interlayer insulating layer 190.

A contact silicide layer 155 may be disposed between the first source/drain contact 170 and the source/drain pattern 150. The contact silicide layer 155 is shown as being formed along a profile of a boundary surface between the source/drain pattern 150 and the first source/drain contact 170, but is not limited thereto. The contact silicide layer 155 may include, for example, a metal silicide material.

The first interlayer insulating layer 190 does not cover an upper surface of the first source/drain contact 170. For example, the upper surface of the first source/drain contact 170 may not be protruded above the upper surface GS_US of the gate structure. The upper surface of the first source/drain contact 170 may be coplanar with the upper surface GS_US of the gate structure. In various embodiments, the upper surface of the first source/drain contact 170 may be protruded above the upper surface GS_US of the gate structure.

The first source/drain contact 170 may include a source/drain contact barrier layer 170a, and a source/drain contact filling layer 170b on the source/drain contact barrier layer 170a. The source/drain contact barrier layer 170a may be extended along a sidewall and a bottom surface of the source/drain contact filling layer 170b.

A bottom surface 170_BS of the source/drain contact is shown as having a wavy shape, but is not limited thereto. In various embodiments, the bottom surface 170_BS of the source/drain contact may have a flat shape.

Although an upper surface of the source/drain contact barrier layer 170a is positioned at substantially the same height as that of an upper surface of the source/drain contact filling layer 170b based on an upper surface AP1_US of the first active pattern, the present disclosure is not limited thereto.

In various embodiments, the upper surface of the source/drain contact barrier layer 170a may be lower than the upper surface of the source/drain contact filling layer 170b based on the upper surface AP1_US of the first active pattern.

The source/drain contact barrier layer 170a may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and a two-dimensional (2D) material. In the semiconductor device according to various embodiments, the two-dimensional material may be a metallic material and/or a semiconductor material. The two-dimensional (2D) material may include a two-dimensional allotrope or a two-dimensional compound, and may include, for example, at least one of graphene, molybdenum disulfide $(MoS_2)$, molybdenum diselenide $(MoSe_2)$, tungsten diselenide $(WSe_2)$, and tungsten disulfide $(WS_2)$, but is not limited thereto. That is, since the two-dimensional material is only listed by way of example, the two-dimensional material that may be included in the semiconductor device of the present disclosure is not limited by the aforementioned materials.

The source/drain contact filling layer 170b may include, for example, at least one of aluminum (Al), tungsten (W), cobalt (Co), ruthenium (Ru), silver (Ag), gold (Au), manganese (Mn), and molybdenum (Mo).

The first source/drain contact 170 is shown as including a plurality of conductive layers, but is not limited thereto. In various embodiments, the first source/drain contact 170 may be a single layer.

The contact liner structure 175 is disposed on the source/drain pattern 150. A lowermost surface of the contact liner structure 175 is not in contact with the source/drain pattern 150. In detail, a lower surface of the contact liner structure 175 is higher than the upper surface of the source/drain pattern 150 in the cross-sectional view taken along the first direction X in which the at least one first active pattern AP1 is extended.

In FIG. 2, the source/drain etch stop layer 160 is disposed between the lower surface of the contact liner structure 175 and an upper surface 150_US of the source/drain pattern 150. The lower surface of the contact liner structure 175 may be the same as a lowermost surface 172_BS of a first bottom portion 172a of a first contact liner 172. At this time, the lowermost surface 172_BS of the first bottom portion 172a is higher than the upper surface 150_US of the source/drain pattern 150.

The contact liner structure 175 is disposed between the first source/drain contact 170 and the first interlayer insulating layer 190.

The contact liner structure 175 includes the first contact liner 172 and a second contact liner 174. The first contact liner 172 may be disposed between the first interlayer insulating layer 190 and the second contact liner 174. The first contact liner 172 may be in contact with the first interlayer insulating layer 190.

The second contact liner 174 may be disposed on the first contact liner 172. The second contact liner 174 may be disposed between the first contact liner 172 and the first source/drain contact 170. The second contact liner 174 may not be in contact with the first interlayer insulating layer 190.

The contact liner structure 175 may be extended along a sidewall 170_SW of the first source/drain contact. The second contact liner 174 may be extended along the sidewall 170_SW of the first source/drain contact. The contact liner structure 175 may not be formed along the bottom surface 170_BS of the source/drain contact. The first contact liner 172 and the second contact liner 174 may not be extended along the bottom surface 170_BS of the first source/drain contact 170.

The contact liner structure 175 is in contact with the first source/drain contact 170. The second contact liner 174 is in contact with the sidewall 170_SW of the first source/drain contact. For example, the second contact liner 174 may be in contact with the source/drain contact barrier layer 170a.

The contact liner structure 175 may be in contact with the source/drain etch stop layer 160. In FIG. 2, the contact liner structure 175 is disposed between the first source/drain contact 170 and the source/drain etch stop layer 160.

The first contact liner 172 may include a first bottom portion 172a and a first vertical portion 172b.

The first bottom portion 172a may be in contact with the source/drain etch stop layer 160. In detail, the lowermost surface 172_BS of the first bottom portion 172a may be in contact with the source/drain etch stop layer 160. The first bottom portion 172a may be disposed below the second contact liner 174.

The first vertical portion 172b may be protruded from the first bottom portion 172a. The first vertical portion 172b may be bent from the first bottom portion 172a. In detail, the first vertical portion 172b may be extended from the first bottom portion 172a in a direction away from the upper surface 150_US of the source/drain pattern 150. The first vertical portion 172b may be in contact with the first interlayer insulating layer 190.

The second contact liner 174 may be surrounded by the first bottom portion 172a and the first vertical portion 172b of the first contact liner 172. In detail, a lower end of the second contact liner 174 may be surrounded by the first bottom portion 172a and the first vertical portion 172b of the first contact liner 172. A lowermost surface 174_BS of the second contact liner 174 may be disposed on the first bottom portion 172a of the first contact liner 172.

The contact liner structure 175 may be extended to the upper surface GS_US of the gate structure. For example, the upper surface 175_US of the contact liner structure 175 may be disposed at the same height as the upper surface GS_US of the gate structure GS.

In the semiconductor device according to various embodiments, the contact liner structure 175 may not pass through the source/drain etch stop layer 160. In other words, the contact liner structure 175 may not be extended to the source/drain pattern 150 by passing through the source/drain etch stop layer 160. For example, the contact liner structure 175 may not be in contact with the contact silicide layer 155.

In FIGS. 2-4, the contact liner structure 175 is extended to the source/drain etch stop layer 160. A lowermost portion of the contact liner structure 175 may be in contact with the source/drain etch stop layer 160.

The contact liner structure 175 includes an insulating material. For example, the contact liner structure 175 may be made of an insulating material.

The contact liner structure 175 may include an insulating material that includes carbon (C) and oxygen (O). For example, the contact liner structure 175 may include silicon oxycarbide (SiOC). For another example, the contact liner structure 175 may include silicon oxycarbide (SiOC) doped with hydrogen (H).

The second contact liner 174 may include a material having a dielectric constant lower than that of the first contact liner 172. For example, the first contact liner 172 may include silicon nitride (SiN), and the second contact liner 174 may include silicon oxycarbide (SiOC).

As the contact liner structure 175 extends away from the upper surface GS_US of the gate structure, a concentration of carbon contained in the contact liner structure 175 may vary. As the contact liner structure 175 extends away from the upper surface 150_US of the source/drain pattern, the concentration of carbon contained in the contact liner structure 175 may vary.

In detail, as the contact liner structure extends away from the upper surface GS_US of the gate structure GS, the concentration of carbon contained in the contact liner structure 175 may be reduced. For example, when the second contact liner 174 includes silicon oxycarbide (SiOC), the concentration of carbon contained in the second contact liner 174 may be reduced as the second contact liner 174 extends away from the upper surface GS_US of the gate structure. In other words, as the second contact liner 174 extends away from the upper surface 150_US of the source/drain pattern, the concentration of carbon contained in the second contact liner 174 may be increased.

For example, at a portion where the contact liner structure 175 is in contact with a first etch stop layer 196, the carbon concentration of the contact liner structure 175 may be within about 10%. At a portion where the contact liner structure 175 is in contact with the source/drain etch stop layer 160, the carbon concentration of the contact liner structure 175 may be within about 5%.

A first height H1 is higher than a second height H2 based on a lower surface GS BS of the gate structure. For example, the concentration of carbon contained in the first contact liner 172 at the first height H1 may be higher than the concentration of carbon contained in the first contact liner 172 at the second height H2. For example, the concentration of carbon contained in the second contact liner 174 at the first height H1 may be higher than the concentration of carbon contained in the second contact liner 174 at the second height H2.

In the semiconductor device according to various embodiments, as the contact liner structure 175 extends away from the upper surface GS_US of the gate structure, a thickness of the contact liner structure 175 may be constant. The contact liner structure 175 extended along the sidewall 170_SW of the first source/drain contact may have a uniform thickness. The thickness of the first contact liner 172 and the thickness of the second contact liner 174 may be constant as the first contact liner 172 and the second contact liner 174 extend away from the upper surface GS_US of the gate structure.

The gate contact 180 may be disposed on the gate electrode 120. The gate contact 180 may be connected to the gate electrode 120 by passing through the gate capping layer 145.

For example, the upper surface of the gate contact 180 may be coplanar with the upper surface GS_US of the gate structure. In various embodiments, the upper surface of the gate contact 180 may be protruded above the upper surface GS_US of the gate structure.

The gate contact 180 may include a gate contact barrier layer 180*a* and a gate contact filling layer 180*b* on the gate contact barrier layer 180*a*. Materials contained in the gate contact barrier layer 180*a* and the gate contact filling layer 180*b* may be the same as those of the source/drain contact barrier layer 170*a* and the source/drain contact filling layer 170*b*.

The first etch stop layer 196 may be disposed on the first interlayer insulating layer 190, the gate structure GS, the first source/drain contact 170, and the gate contact 180. A second interlayer insulating layer 191 is disposed on the first etch stop layer 196.

The first etch stop layer 196 may be disposed on the first interlayer insulating layer 190, the gate structure GS, the first source/drain contact 170, and the gate contact 180. The second interlayer insulating layer 191 is disposed on the first etch stop layer 196.

The first etch stop layer 196 may include a material having an etch selectivity with respect to the second interlayer insulating layer 191. The first etch stop layer 195 may include, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), aluminum oxide (AlO), aluminum nitride (AlN), aluminum oxycarbide (AlOC), and their combination. The first etch stop layer 196 is shown as a single layer, but is not limited thereto. In various embodiments, the first etch stop layer 196 may not be formed. The second interlayer insulating layer 191 may include, for example, at least one of silicon oxide, silicon nitride, silicon carbonitride, silicon oxynitride, and a low dielectric constant material.

The first and second via plug 206, 208 may be disposed in the second interlayer insulating layer 191. The first via plug 206 may be directly connected to the first source/drain contact 170, and the second via plug 208 may be directly connected to the gate contact 180, by passing through the first etch stop layer 196.

The first via plug 206 may include a via barrier layer 206*a* and a via filling layer 206*b*. The via barrier layer 206*a* may extend along a sidewall and a bottom surface of the via filling layer 206*b*. The via barrier layer 206*a* may include, for example, at least one of tantalum (Ta), tantalum nitride (TaN), titanium (Ti), titanium nitride (TiN), titanium silicon nitride (TiSiN), nickel (Ni), nickel boron (NiB), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and a two-dimensional (2D) material. The via filling layer 206*b* may include, for example, at least one of aluminum (Al), tungsten (W), cobalt (Co), ruthenium (Ru), copper (Cu), silver (Ag), gold (Au), manganese (Mn), and molybdenum (Mo). The second via plug 208 may include a via barrier layer 208*a* and a via filling layer 208*b* similar to the via barrier layer 206*a* and the via filling layer 206*b* of the first via plug 206.

The second etch stop layer 197 may be disposed between the second interlayer insulating layer 191 and a third interlayer insulating layer 192. The second etch stop layer 197 may be extended along an upper surface of the second interlayer insulating layer 191.

The second etch stop layer 197 may include a material having an etch selectivity with respect to the third interlayer insulating layer 192. The material contained in the second etch stop layer 197 may be the same as that of the first etch stop layer 196. The second etch stop layer 197 is shown as a single layer, but is not limited thereto. In various embodiments, the second etch stop layer 197 may not be formed. The third interlayer insulating layer 192 may include, for example, at least one of silicon oxide, silicon nitride, silicon carbonitride, silicon oxynitride, and a low dielectric constant material.

The first and second wiring line 207, 209 may be disposed in the third interlayer insulating layer 192. The first wiring line 207 is connected to the first via plug 206, and the second wiring line 209 is connected to the second via plug 208. The first wiring line 207 may be in contact with the first via plug 206, and the second wiring line 209 may be in contact with the second via plug 208.

The first wiring line 207 may include a wiring barrier layer 207*a* and a wiring filling layer 207*b*. The wiring barrier layer 207*a* may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and a two-dimensional (2D) material. Each of the wiring filling layers 207*b* may include, for example, at least one of aluminum (Al), copper (Cu), tungsten (W), cobalt (Co), ruthenium (Ru), silver (Ag), gold (Au), manganese (Mn), and molybdenum (Mo). The second wiring line 209 may include a wiring barrier layer 209*a* and a wiring filling layer 209*b* similar to the wiring barrier layer 207*a* and the wiring filling layer 207*b* of the first wiring line 207.

In various embodiments, the wiring barrier layer 207*a* may not be disposed between the via filling layer 206*b* and the wiring filling layer 207*b*. A first connection contact may be further disposed between the first via plug 206 and the first source/drain contact 170 to connect the first via plug 206 with the first source/drain contact 170. Further, a second connection contact may be further disposed between the second via plug 208 and the gate contact 180 to connect the second via plug 208 with the gate contact 180.

Figure 6:
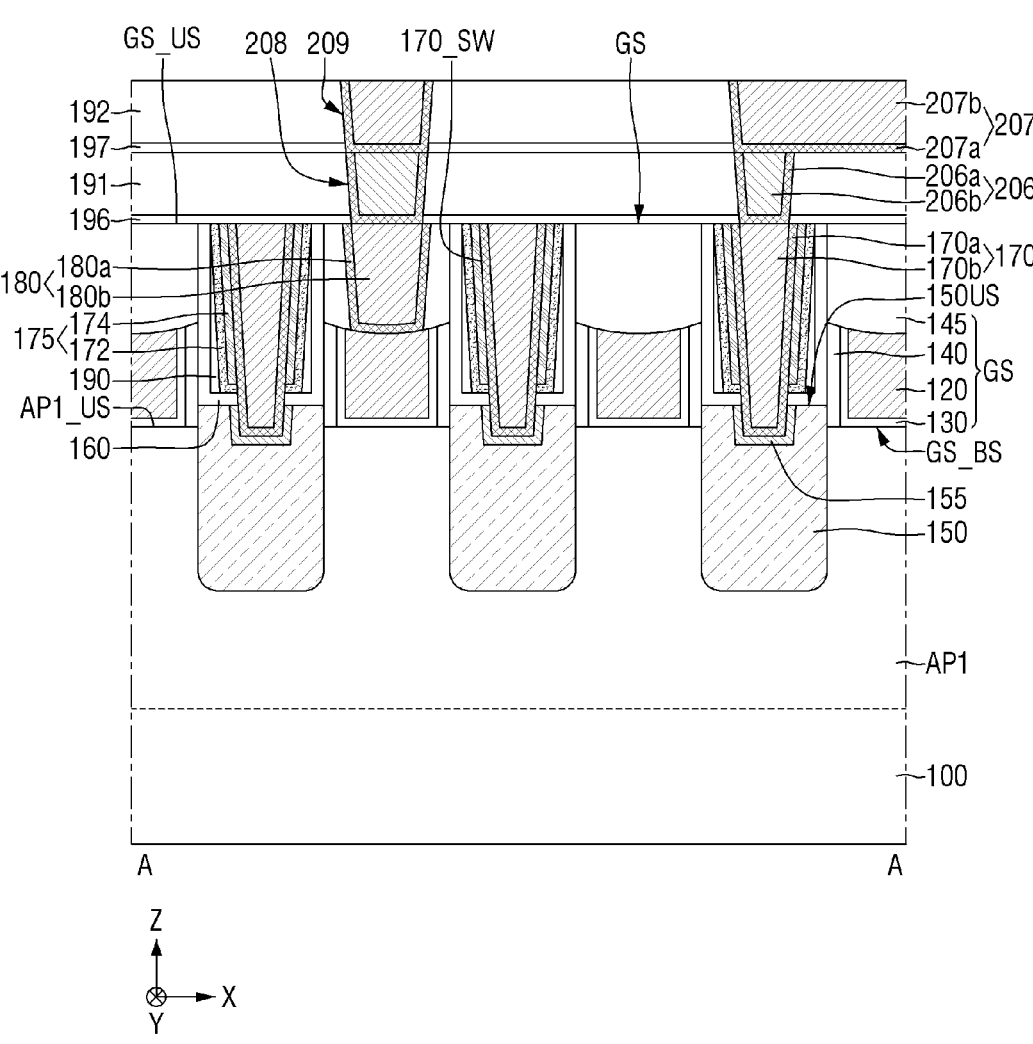
FIG. 6 is a view illustrating a semiconductor device, according to various embodiments.

FIG. 6 is a view illustrating a semiconductor device, according to various embodiments. For convenience of description, the following description will be based on differences from those described with reference to FIGS. 1-5.

Referring to FIG. 6, the upper surface 150_US of the source/drain pattern 150 may be higher than the lower surface GS BS of the gate structure GS.

Figure 7:
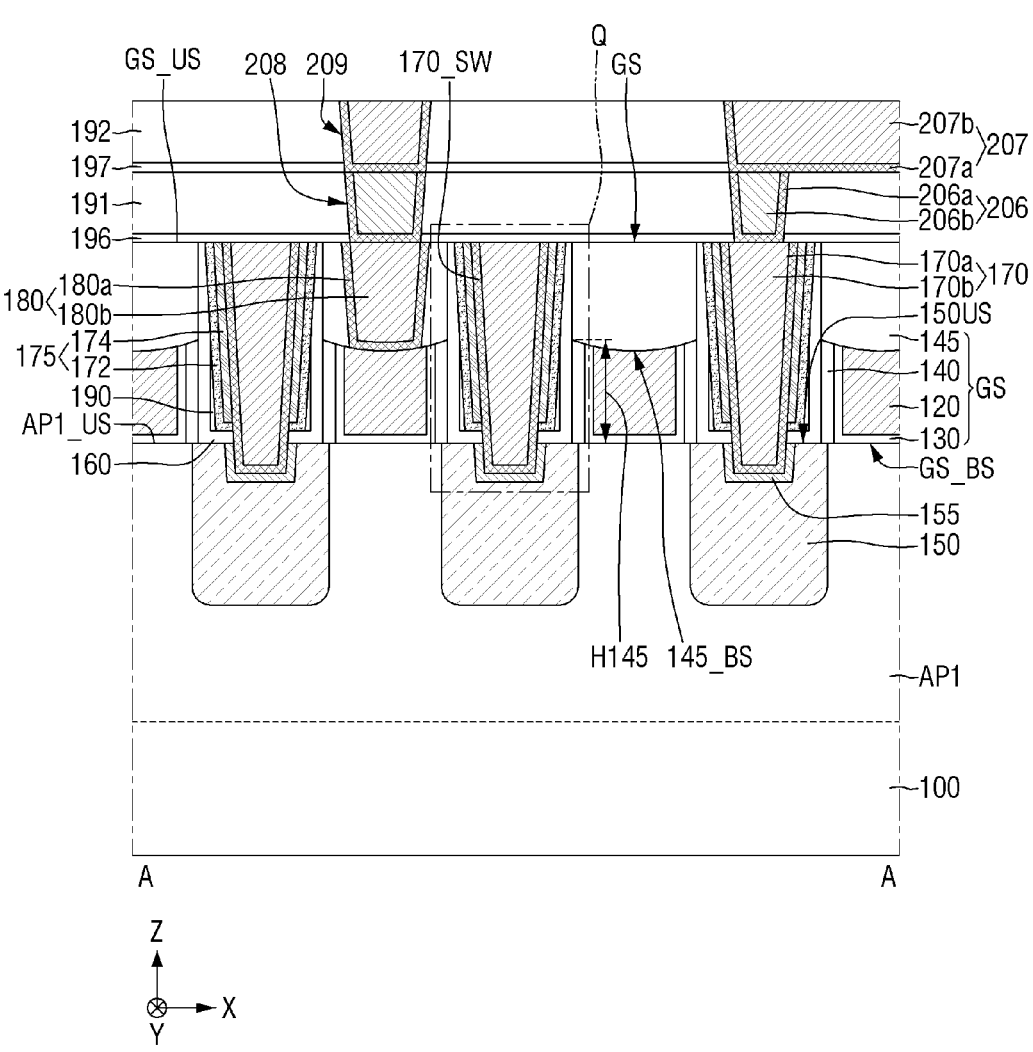
FIG. 7 is a view illustrating a semiconductor device, according to various embodiments.
Figure 8:
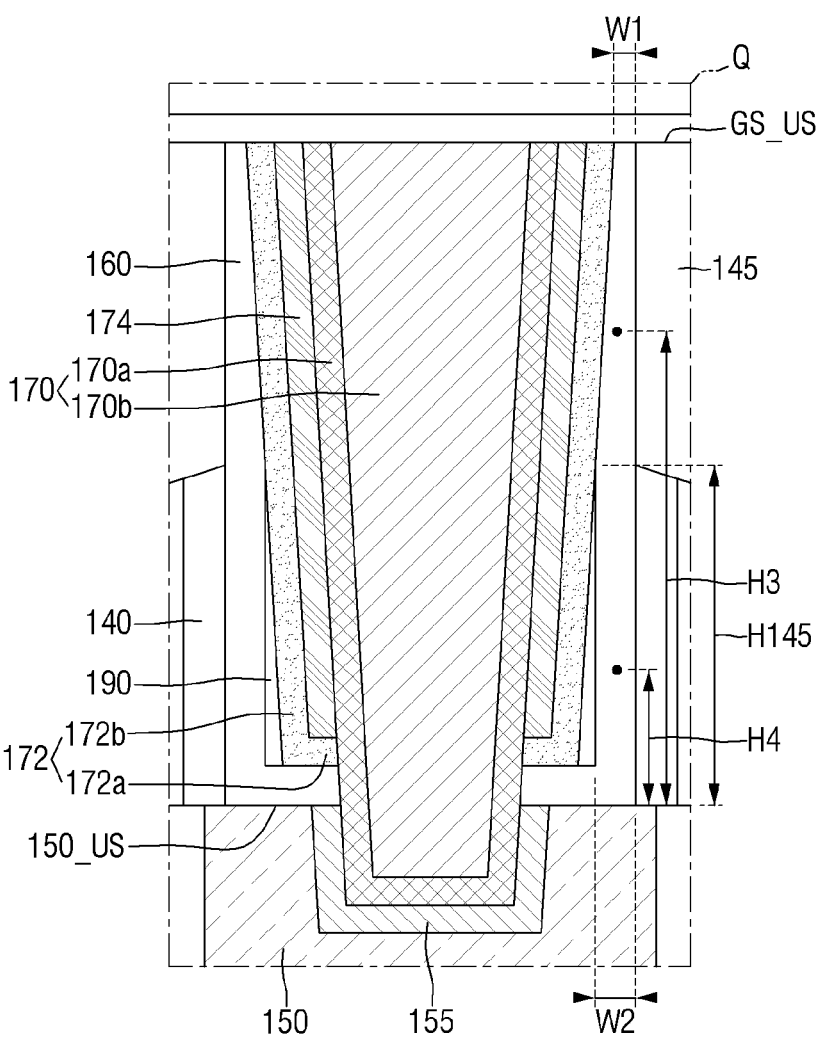
FIG. 8 is an enlarged view illustrating a portion Q of FIG. 7, according to various embodiments.

FIG. 7 is a view illustrating a semiconductor device, according to various embodiments. FIG. 8 is an enlarged view illustrating a portion Q of FIG. 7, according to various embodiments. For convenience of description, the description will be based on differences from those described with reference to FIGS. 1-5.

Referring to FIGS. 7 and 8, the first contact liner 172 may be in contact with the source/drain etch stop layer 160. In detail, an upper end of the first contact liner 172 may be in contact with the source/drain etch stop layer 160.

A width of the source/drain etch stop layer 160 in the first direction X at the same height as the upper surface GS_US of the gate structure is a first width W1. The width of the source/drain etch stop layer 160 in the first direction X at the same height as the upper surface 150_US of the source/drain pattern is a second width W2. At this time, the first width W1 is smaller than the second width W2.

The gate capping layer 145 may encounter the source/drain etch stop layer 160 at a capping height H145. In detail, the capping height H145 may refer to the height from the lower surface GS BS of the gate structure GS to a point where a lower surface 145_BS of the gate capping layer 145 is in contact with the source/drain etch stop layer 160. The source/drain etch stop layer 160 may be in contact with the gate capping layer 145 at a position higher than the capping height H145. The source/drain etch stop layer 160 may be in contact with the gate spacer 140 at a position lower than the capping height H145.

A third height H3 is higher than the capping height H145. The fourth height H4 is lower than the capping height H145. A width of the source/drain etch stop layer 160 at the third height H3 is smaller than a width of the source/drain etch stop layer 160 at the fourth height H4.

The contact liner structure 175 may be in contact with the source/drain etch stop layer 160 at the capping height H145. In detail, the first contact liner 172 may be in contact with the source/drain etch stop layer 160 at the capping height H145. The first contact liner 172 may be in contact with the source/drain etch stop layer 160 at a position higher than the capping height H145.

At a position lower than the capping height H145, the first contact liner 172 does not contact the source/drain etch stop layer 160. The first contact liner 172 may be in contact with the first interlayer insulating layer 190 at a position lower than the capping height H145. The first interlayer insulating layer 190 is disposed between the first contact liner 172 and the source/drain etch stop layer 160 at a position lower than the capping height H145.

Figure 9:
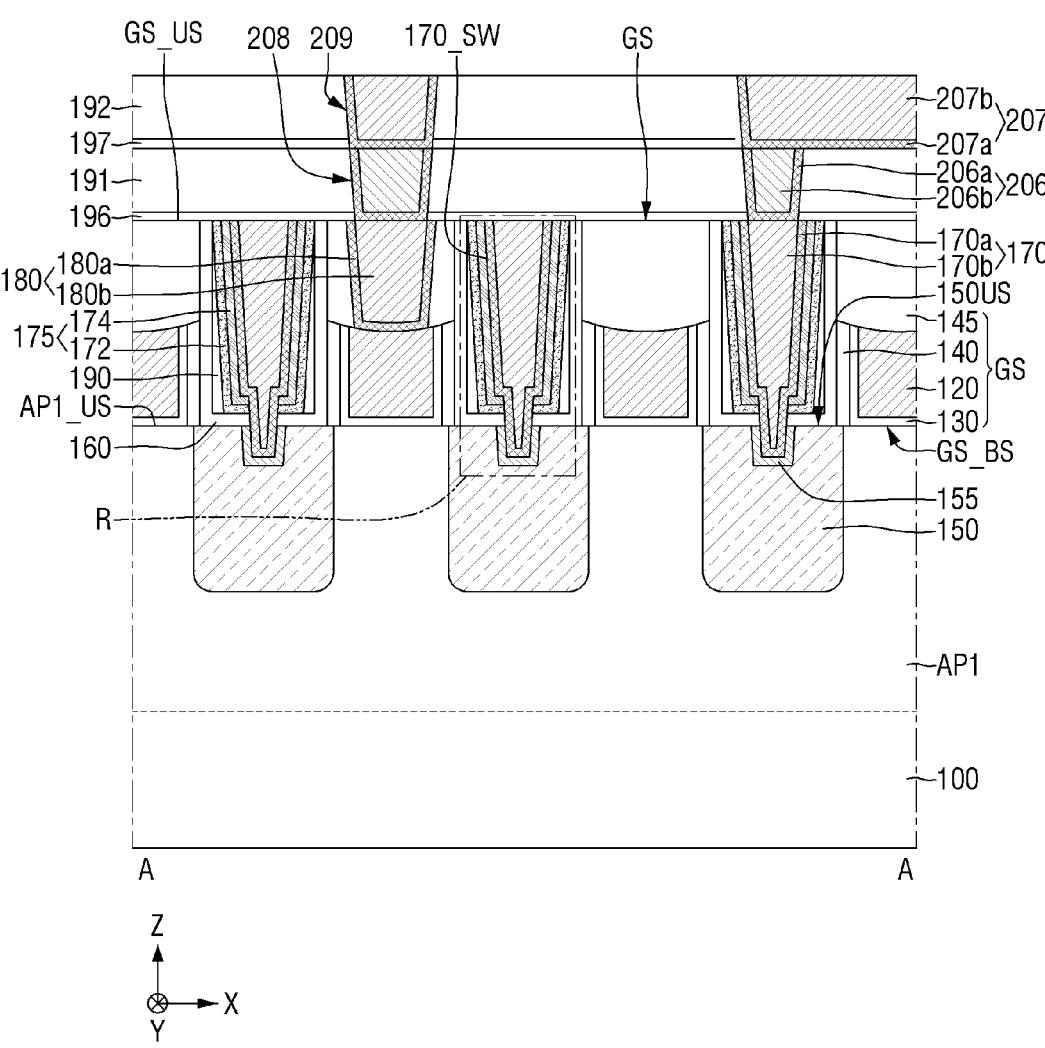
FIG. 9 is a view illustrating a semiconductor device, according to various embodiments.
Figure 10:
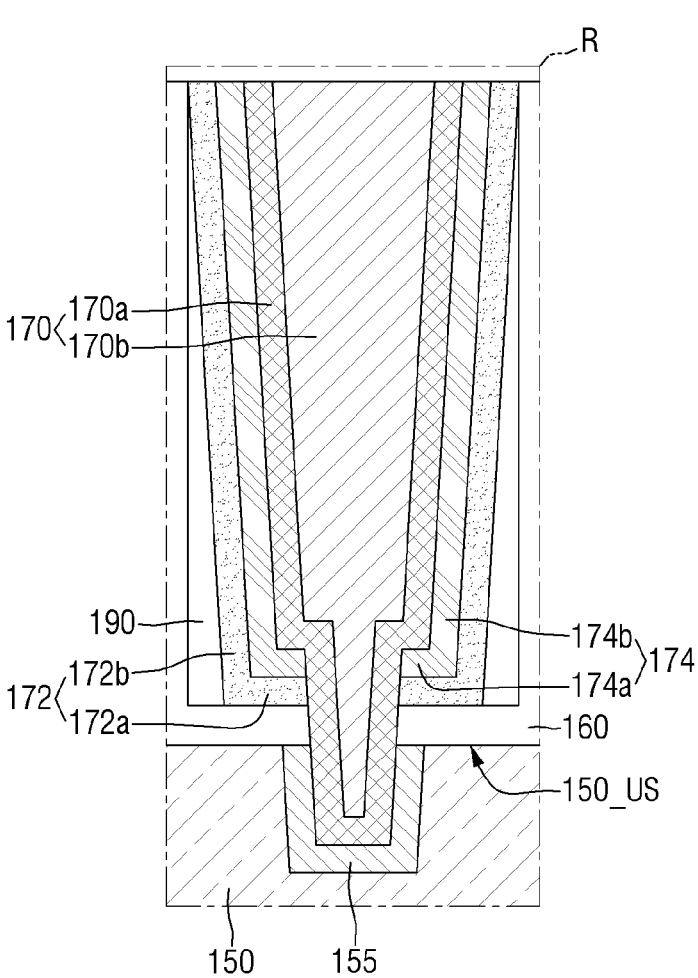
FIG. 10 is an enlarged view illustrating a portion R of FIG. 9, according to various embodiments.
Figure 11:
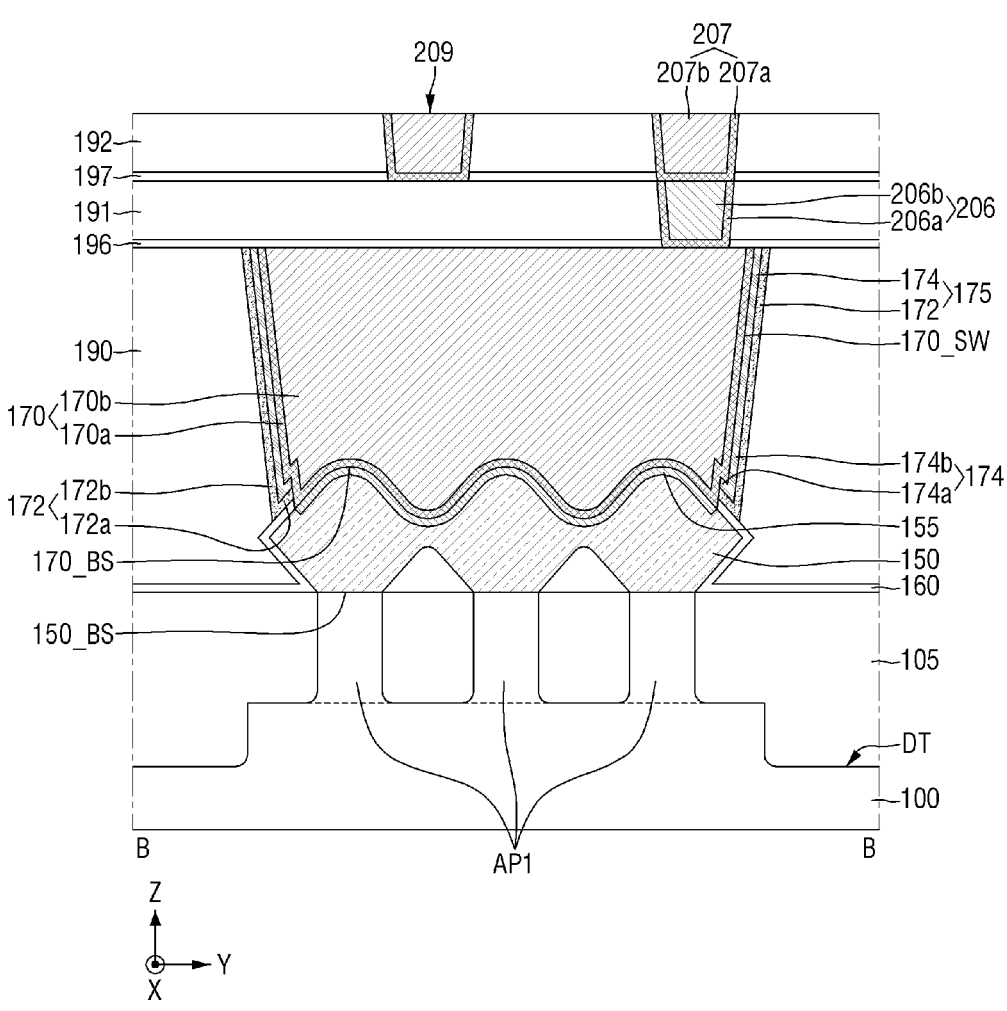
FIG. 11 is a diagram illustrating a semiconductor device, according to various embodiments.

FIG. 9 is a view illustrating a semiconductor device, according to various embodiments. FIG. 10 is an enlarged view illustrating a portion R of FIG. 9, according to various embodiments. FIG. 11 is a diagram illustrating a semiconductor device, according to various embodiments. For convenience of description, the following description will be based on differences from those described with reference to FIGS. 1-5.

Referring to FIGS. 9-11, the second contact liner 174 may include a second bottom portion 174a and a second vertical portion 174b.

The second bottom portion 174a and the second vertical portion 174b may be surrounded by the first bottom portion 172a and the first vertical portion 172b. The second bottom portion 174a may be disposed on the first bottom portion 172a of the first contact liner 172.

The second vertical portion 174b may be protruded from the second bottom portion 174a. The second vertical portion 174b may be bent from the second bottom portion 174a. In detail, the second vertical portion 174b may be extended from the second bottom portion 174a in a direction away from the upper surface 150_US of the source/drain pattern 150. The second vertical portion 174b may be extended along the first vertical portion 172b. The second vertical portion 174b may be extended between the first source/drain contact 170 and the first vertical portion 172b.

The first source/drain contact 170 may be extended along a curved profile of the second vertical portion 174b and the second bottom portion 174a of the second contact liner 174.

Figure 12:
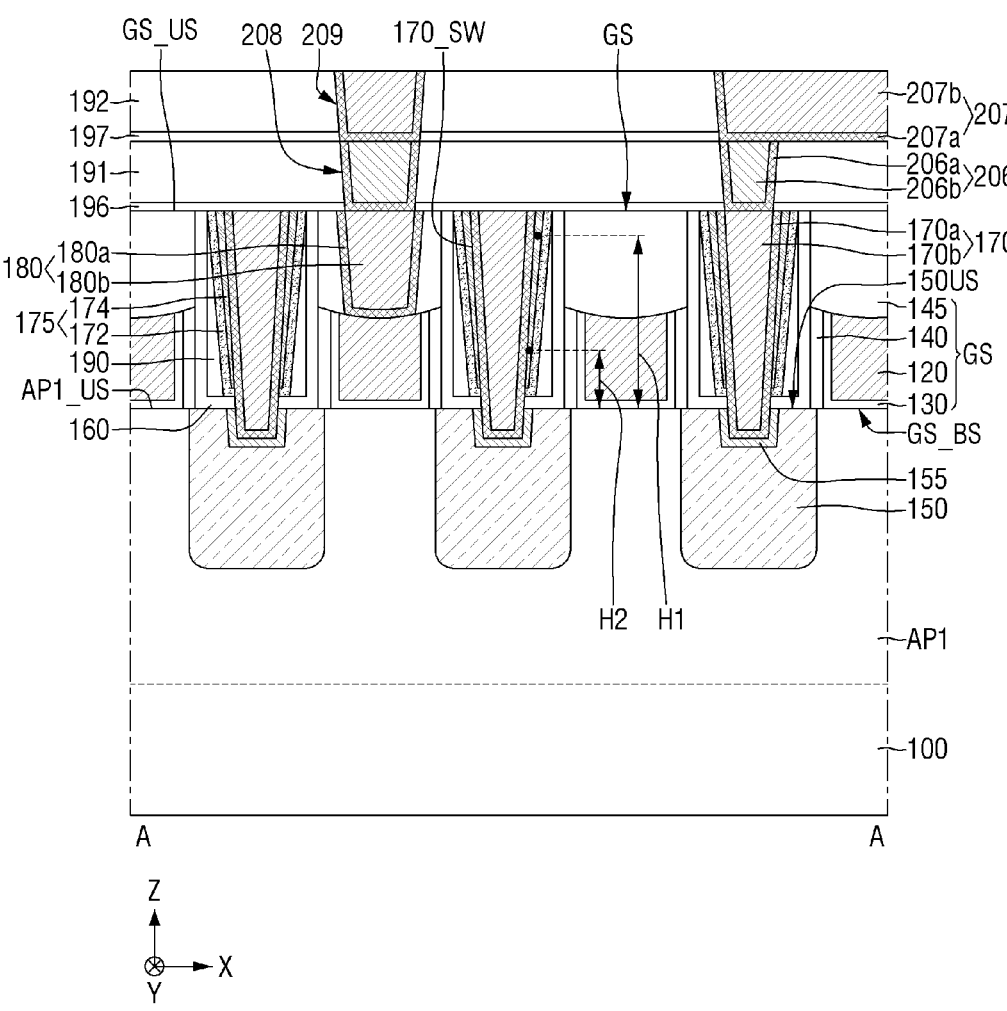
FIG. 12 is a view illustrating a semiconductor device, according to various embodiments.
Figure 13:
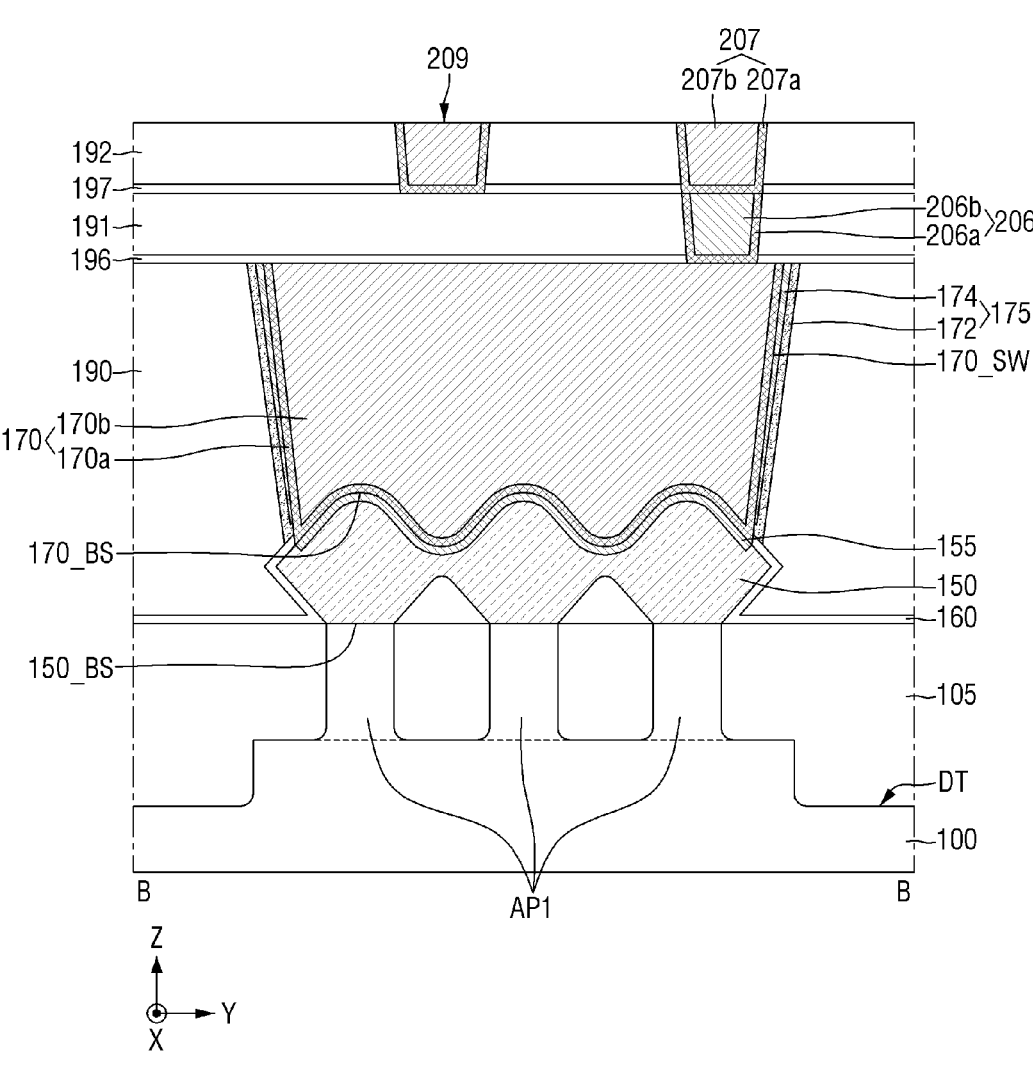
FIG. 13 is a view illustrating a semiconductor device, according to various embodiments.

FIGS. 12 and 13 are views illustrating a semiconductor device according to various embodiments. For convenience of description, the following description will be based on differences from those described with reference to FIGS. 1-5.

Referring to FIGS. 12 and 13, a thickness of the contact liner structure 175 may vary as the contact liner structure 175 extends away from the upper surface GS_US of the gate structure. As the contact liner structure 175 extends away from the upper surface GS_US of the gate structure, the thickness of the contact liner structure 175 may be reduced.

For example, a thickness of the second contact liner 174 may be reduced as the second contact liner 174 extends away from the upper surface GS_US of the gate structure. The thickness of the second contact liner 174 may be thicker at the first height H1 than the second height H2. The first height H1 is higher than the second height H2 based on the lower surface GS BS of the gate structure GS.

The first contact liner 172 is shown as having a constant thickness in FIGS. 12 and 13, but the embodiment is not limited thereto. For example, as the first contact liner 172 extends away from the upper surface GS_US of the gate structure, the thickness of the first contact liner 172 may be reduced.

Figure 14:
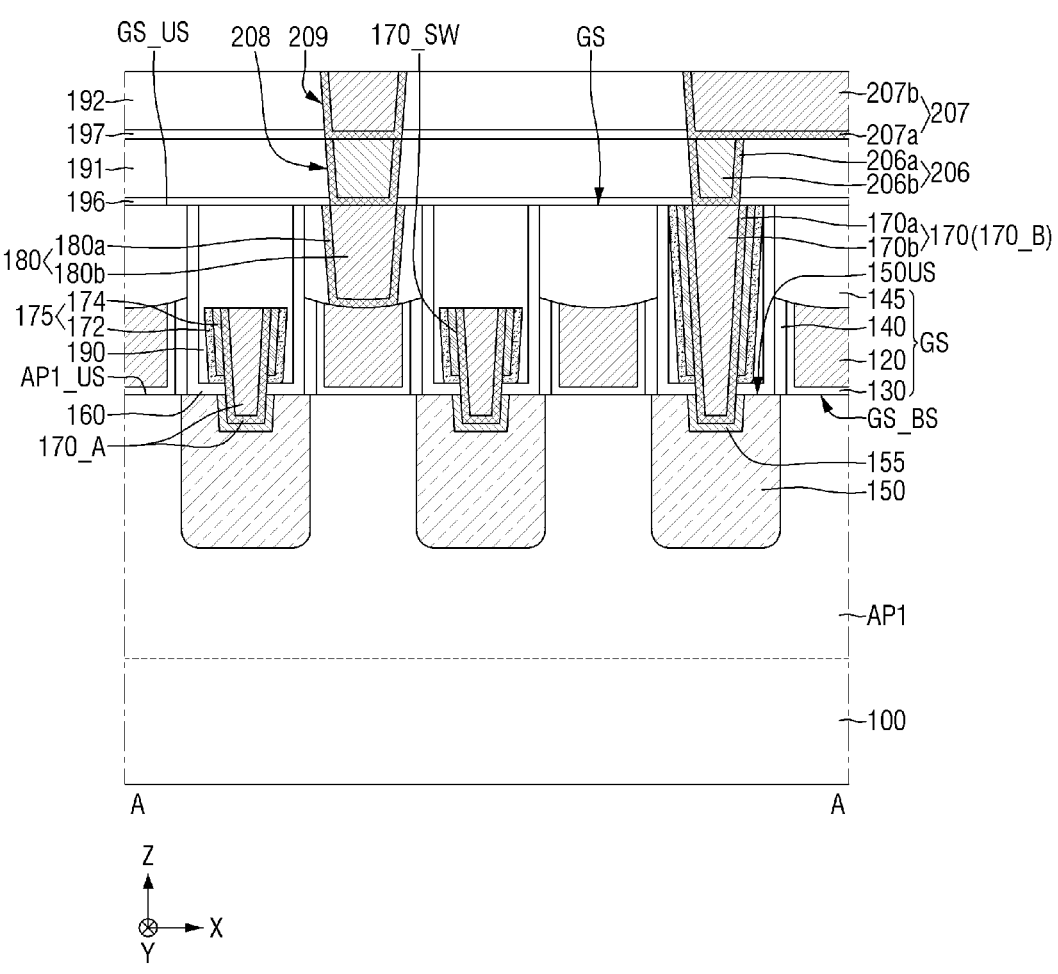
FIG. 14 is a view illustrating a semiconductor device, according to various embodiments.
Figure 15:
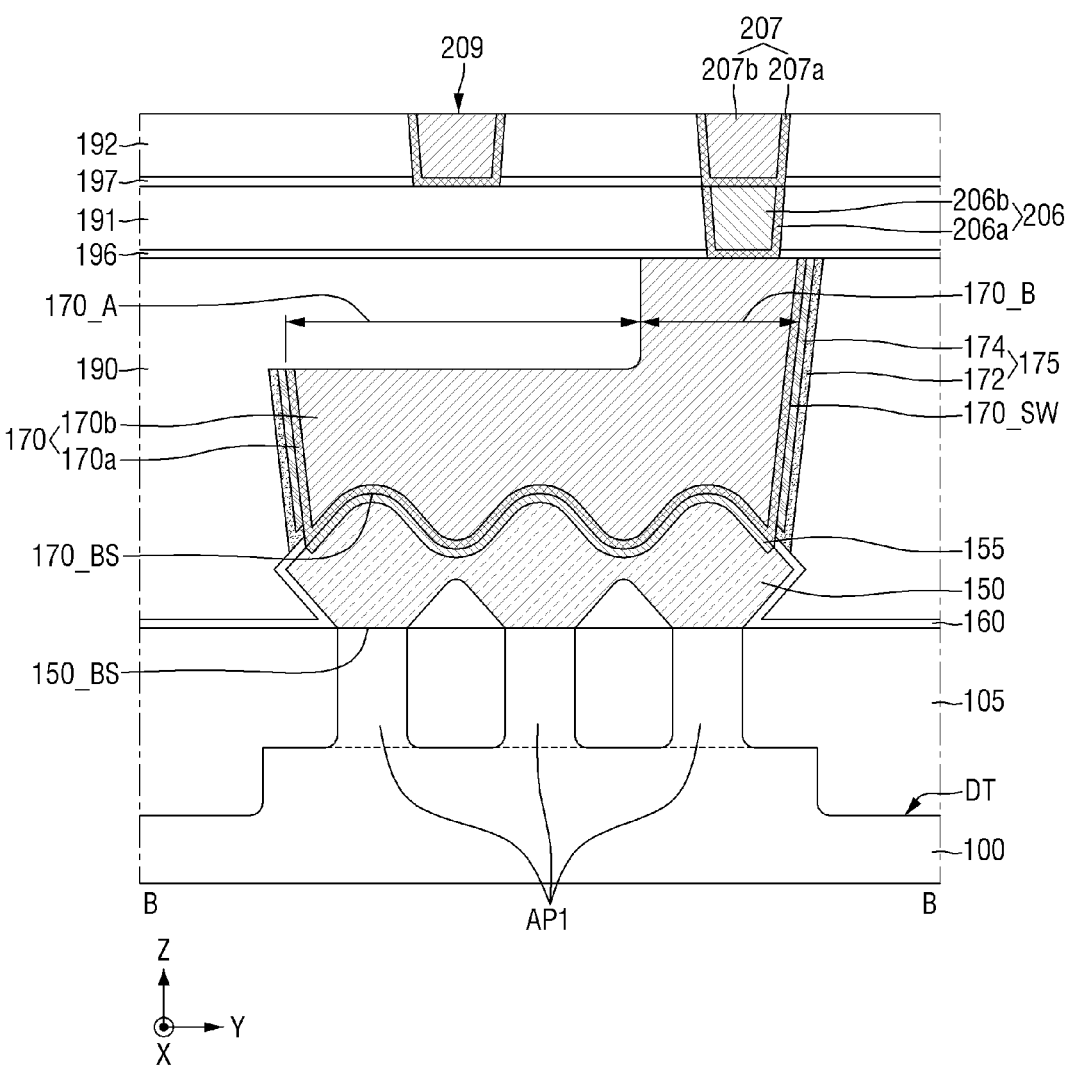
FIG. 15 is a view illustrating a semiconductor device, according to various embodiments.

FIGS. 14 and 15 are views illustrating a semiconductor device, according to various embodiments. For convenience of description, the following description will be based on differences from those described with reference to FIGS. 1-5.

Referring to FIGS. 14 and 15, the first source/drain contact 170 may include a first portion 170_A and a second portion 170_B.

The first portion 170_A of the first source/drain contact may be directly connected to the second portion 170_B of the first source/drain contact.

The second portion 170_B of the first source/drain contact is a portion in which the first via plug 206 is landed. The first source/drain contact 170 may be connected to the first wiring line 207 through the second portion 170_B of the first source/drain contact. The first portion 170_A of the first source/drain contact is not a portion in which the first via plug 206 is landed.

For example, in the cross-sectional view of FIG. 14, the second portion 170_B of the first source/drain contact may be positioned in a portion connected to the first via plug 206. The first portion 170_A of the first source/drain contact may be positioned in a portion that is not connected to the first via plug 206.

In order to prevent the gate contact 180 and the first source/drain contact 170 from being short-circuited, the first portion 170_A of the first source/drain contact may be positioned on both sides of the gate structure GS of the portion connected to the gate contact 180, and the second portion 170_B of the first source/drain contact may not be positioned. That is, in the cross-sectional view of FIG. 14, on both sides of the gate structure GS connected to the gate contact 180, the first portion 170_A of the first source/drain contact may be positioned, and the second portion 170_B of the first source/drain contact may not be positioned.

An upper surface of the second portion 170_B of the first source/drain contact is higher than the first portion 170_A of the first source/drain contact. In FIG. 15, the upper surface of the second portion 170_B of the first source/drain contact is higher than the first portion 170_A of the first source/drain contact based on the upper surface of the field insulating layer 105. For example, the upper surface of the first source/drain contact 170 may be an upper surface of the second portion 170_B of the first source/drain contact.

In FIG. 15, the first source/drain contact 170 is shown as having an L-shape, but is not limited thereto. In various embodiments, the first source/drain contact 170 may have a T-shape rotated as much as 180 degrees. In this case, the first portion 170_A of the first source/drain contact may be disposed on both sides of the second portion 170_B of the first source/drain contact.

The contact liner structure 175 is extended along the sidewall 170_SW of the first source/drain contact. In the first portion 170_A of the first source/drain contact, the contact liner structure 175 is not more protruded in the third direction Z than the upper surface of the first portion 170_A of the first source/drain contact. In the second portion 170_B of the first source/drain contact, the contact liner structure 175 may be extended to the upper surface of the first source/drain contact 170.

The first interlayer insulating layer 190 may not cover the upper surface of the second portion 170_B of the first source/drain contact. The first interlayer insulating layer 190 may cover the upper surface of the first portion 170_A of the first source/drain contact.

In FIG. 15, the first interlayer insulating layer 190 may include a first portion and a second portion. The first portion of the first interlayer insulating layer 190 may be a portion of the first interlayer insulating layer 190, which overlaps the upper surface of the first portion 170_A of the first source/drain contact in the third direction Z. The second portion of the first interlayer insulating layer 190 may be the other portion except for the first portion of the first interlayer insulating layer 190.

The first portion of the first interlayer insulating layer 190 and the second portion of the first interlayer insulating layer 190 are formed by their respective manufacturing processes different from each other. The first source/drain contact 170 shown in FIG. 15 may be formed by removing a portion of the first source/drain contact 170 shown in FIG. 4. For example, a portion of the first source/drain contact 170 shown in FIG. 4 may be removed to form the first portion 170_A of the first source/drain contact shown in FIG. 15. A space on the upper surface of the first portion 170_A of the first source/drain contact may be filled with an insulating material to form the second portion of the first interlayer insulating layer 190.

Figure 16:
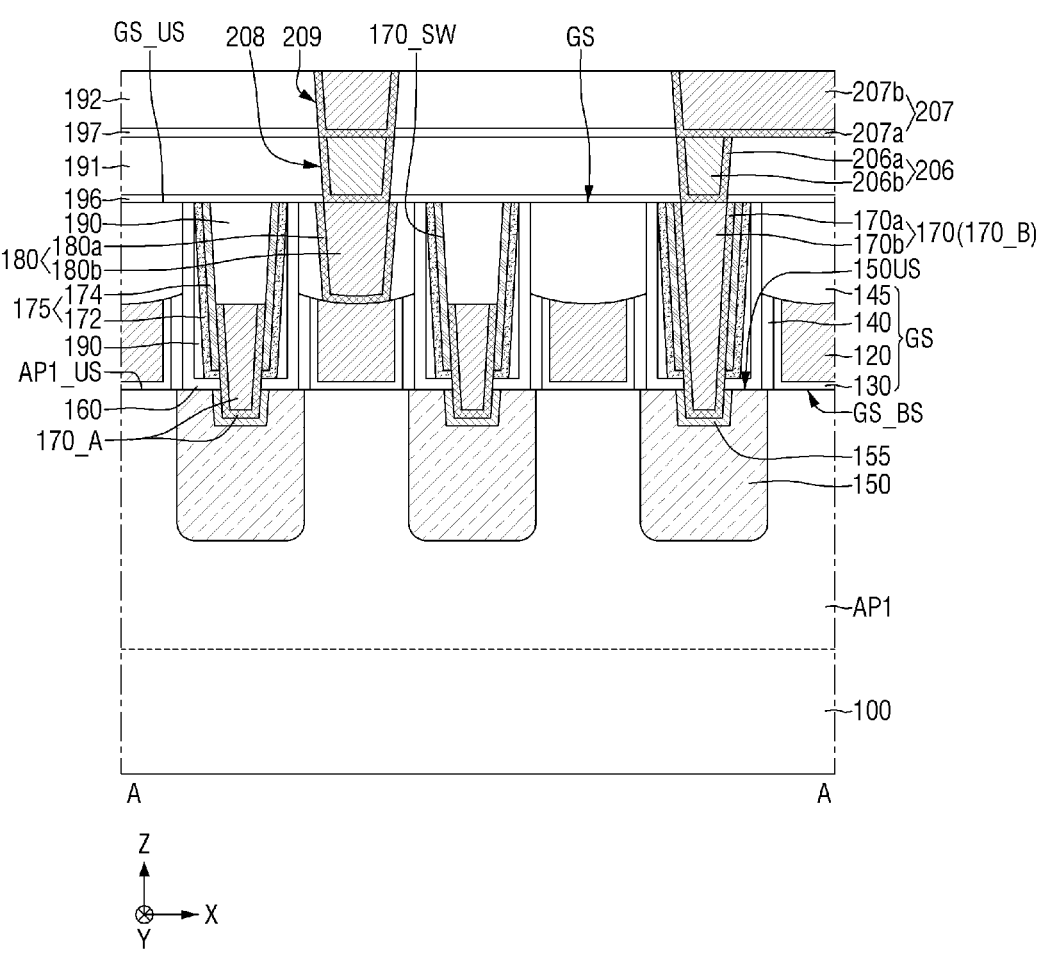
FIG. 16 is a view illustrating a semiconductor device, according to various embodiments.
Figure 17:
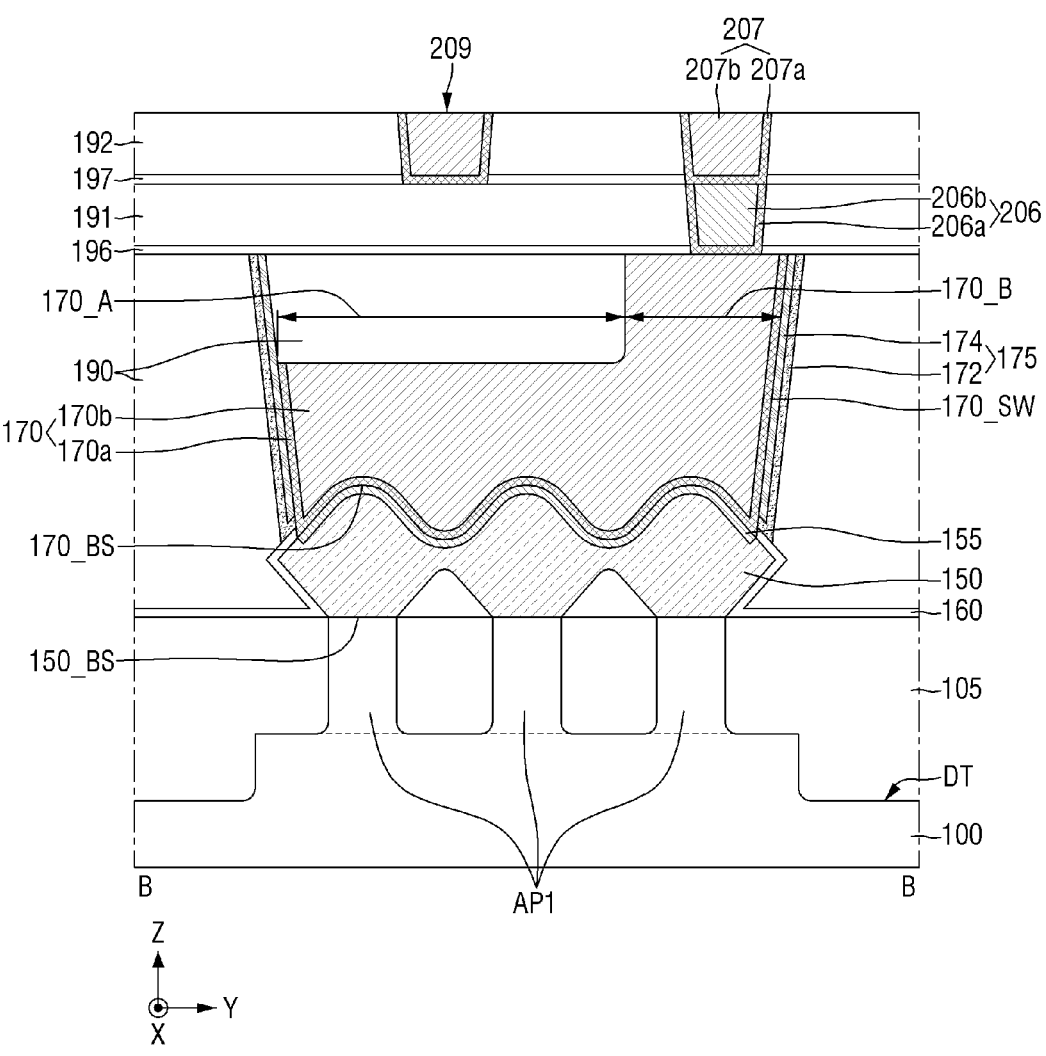
FIG. 17 is a view illustrating a semiconductor device, according to various embodiments.

FIGS. 16 and 17 are views illustrating a semiconductor device, according to various embodiments. For convenience of description, the following description will be based on differences from those described with reference to FIGS. 14 and 15.

Referring to FIGS. 16 and 17, in the first portion 170_A of the first source/drain contact, the contact liner structure

175 is more protruded in the third direction Z than the upper surface of the first portion 170_A of the first source/drain contact. In the first portion 170_A of the first source/drain contact, the first contact liner 172 and the second contact liner 174 may be more protruded in the third direction Z than the upper surface of the first portion 170_A of the first source/drain contact.

In the first portion 170_A of the first source/drain contact, the contact liner structure 175 is shown as being extended to the upper surface GS_US of the gate structure or the first etch stop layer 196, but is not limited thereto.

In FIG. 16, a portion of the first interlayer insulating layer 190 may be disposed on the upper surface of the first portion 170_A of the first source/drain contact, and may be disposed between the contact liner structure 175. Also, in FIG. 17, a portion of the first interlayer insulating layer 190 may be disposed between the second portion 170_B of the first source/drain contact and the contact liner structure 175. A portion of the first interlayer insulating layer 190 may correspond to a first portion of the first interlayer insulating layer 190 described in FIGS. 14 and 15.

Figure 18:
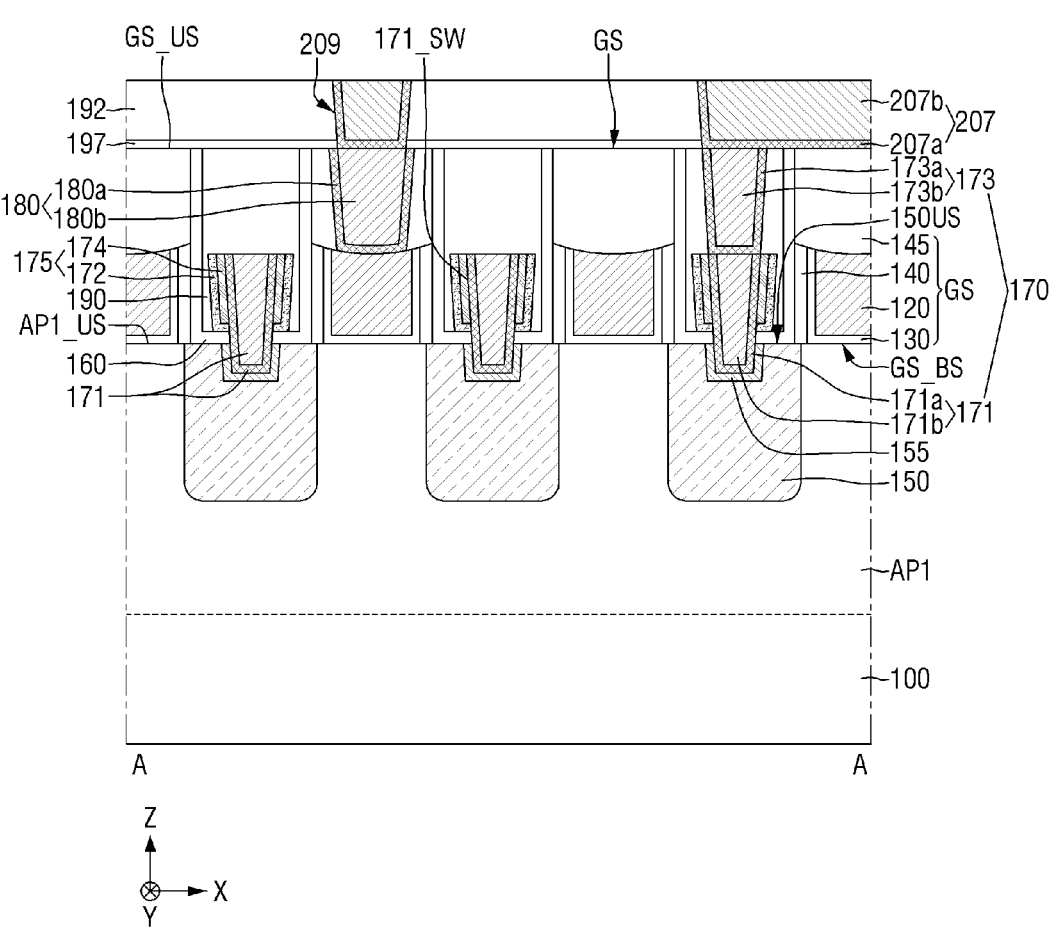
FIG. 18 is a view illustrating a semiconductor device, according to various embodiments.
Figure 19:
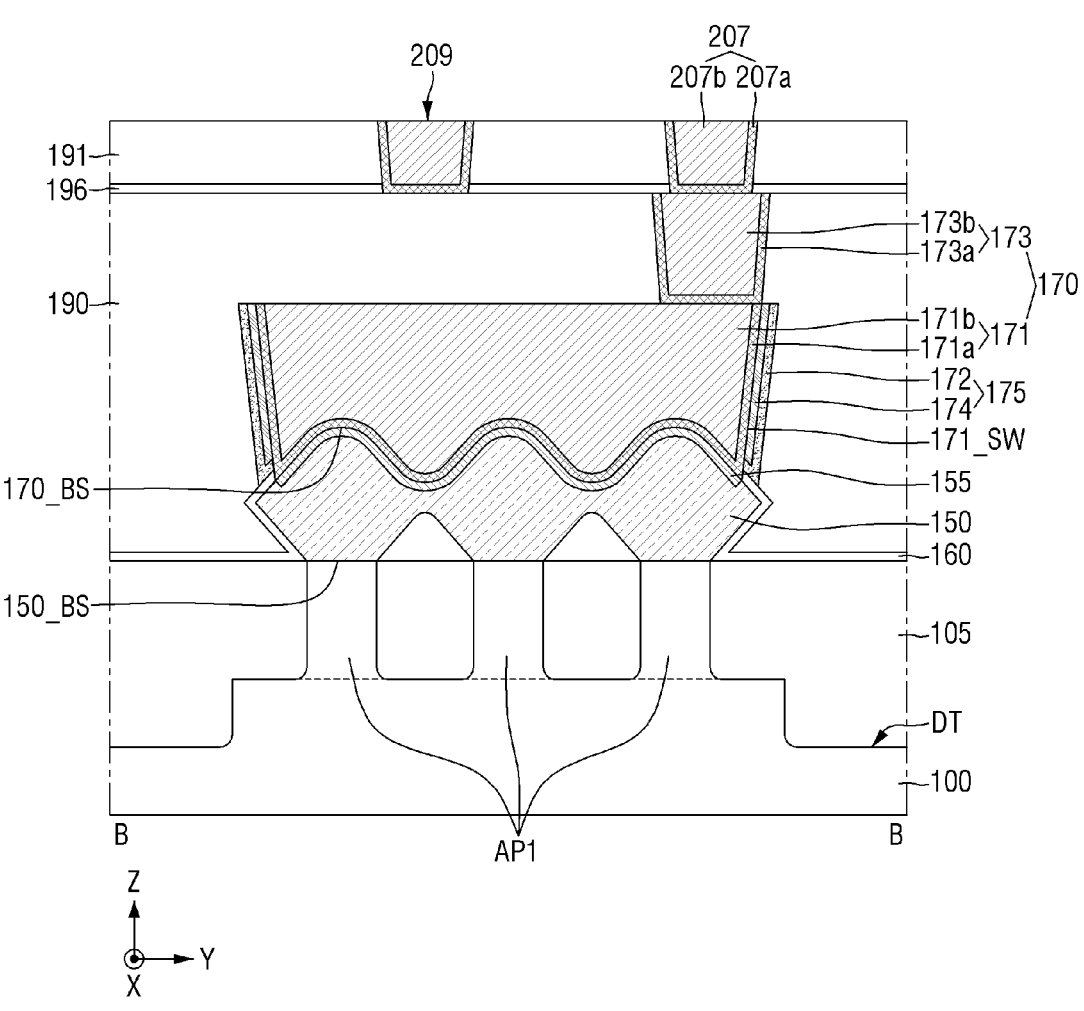
FIG. 19 is a view illustrating a semiconductor device, according to various embodiments.

FIGS. 18 and 19 are views illustrating a semiconductor device, according to various embodiments. For convenience of description, the following description will be based on differences from those described with reference to FIGS. 1-5.

Referring to FIGS. 18 and 19, the first source/drain contact 170 may include a lower source/drain contact 171 and an upper source/drain contact 173.

The lower source/drain contact 171 may include a lower source/drain contact barrier layer 171a and a lower source/drain contact filling layer 171b. The upper source/drain contact 173 may include an upper source/drain contact barrier layer 173a and an upper source/drain contact filling layer 173b.

The upper surface of the first source/drain contact 170 may be an upper surface of the upper source/drain contact 173.

The materials contained in the lower source/drain contact barrier layer 171a and the upper source/drain contact barrier layer 173a may be the same as those of the source/drain contact barrier layer 170a. The materials contained in the lower source/drain contact filling layer 171b and the upper source/drain contact filling layer 173b may be the same as those of the source/drain contact filling layer 170b. In various embodiments, the upper source/drain contact 173 may be formed of a single layer.

The contact liner structure 175 may be extended along a sidewall 171_SW of the lower source/drain contact.

For example, the contact liner structure 175 may not be extended along a sidewall of the upper source/drain contact 173. In this case, the contact liner structure 175 is not extended to the upper surface GS_US of the gate structure.

In various embodiments, the contact liner structure 175 may be extended along at least a portion of the sidewall of the upper source/drain contact 173. For example, the contact liner structure 175 may be extended to the upper surface GS_US of the gate structure. For another example, the contact liner structure 175 may not be extended to the upper surface GS_US of the gate structure.

The first wiring line 207 may be connected to the first source/drain contact 170 and the second wiring line 209 may be connected to the gate contact 180 without the first and second via plug (206, 208 of FIG. 2), respectively. The first and second wiring line 207, 209 may be disposed in the first etch stop layer 196 and the second interlayer insulating layer 191.

Figure 20:
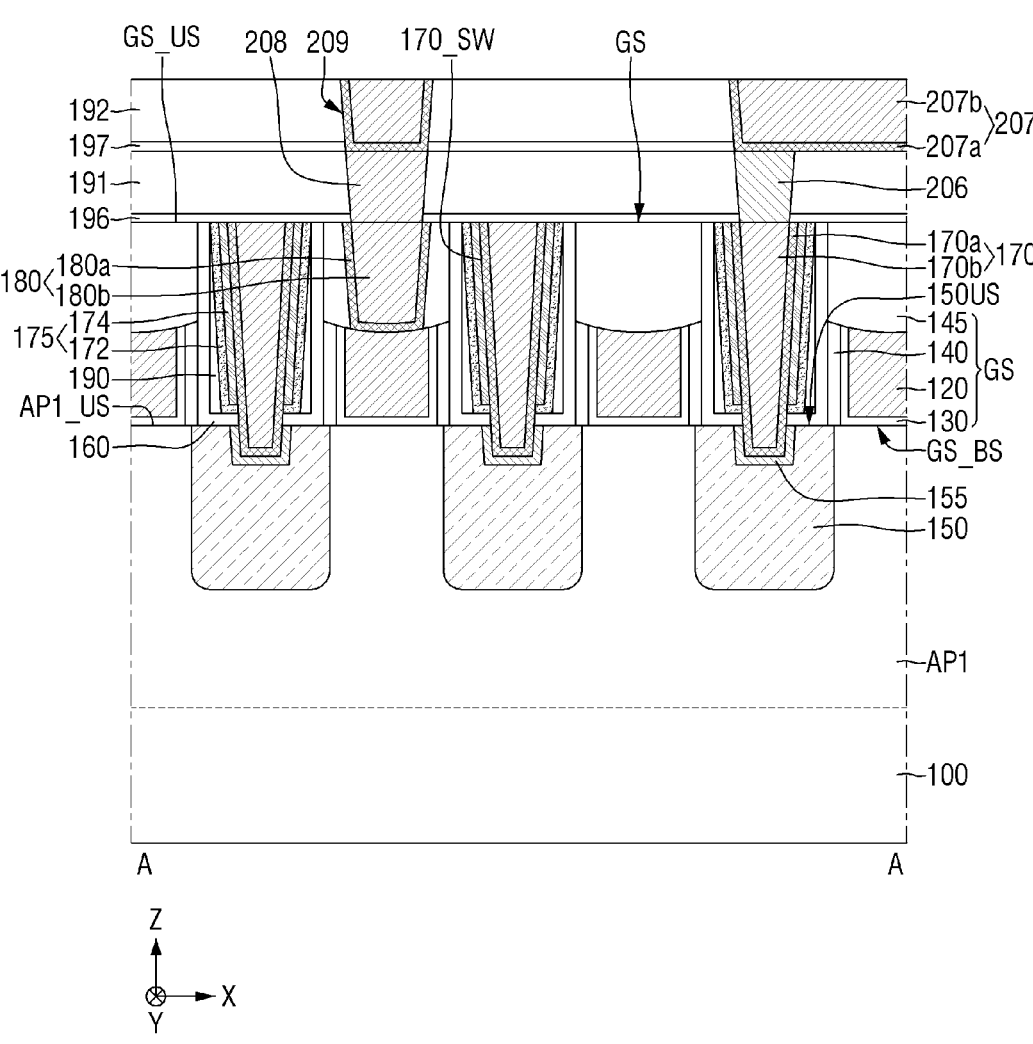
FIG. 20 is a view illustrating a semiconductor device, according to various embodiments.
Figure 21:
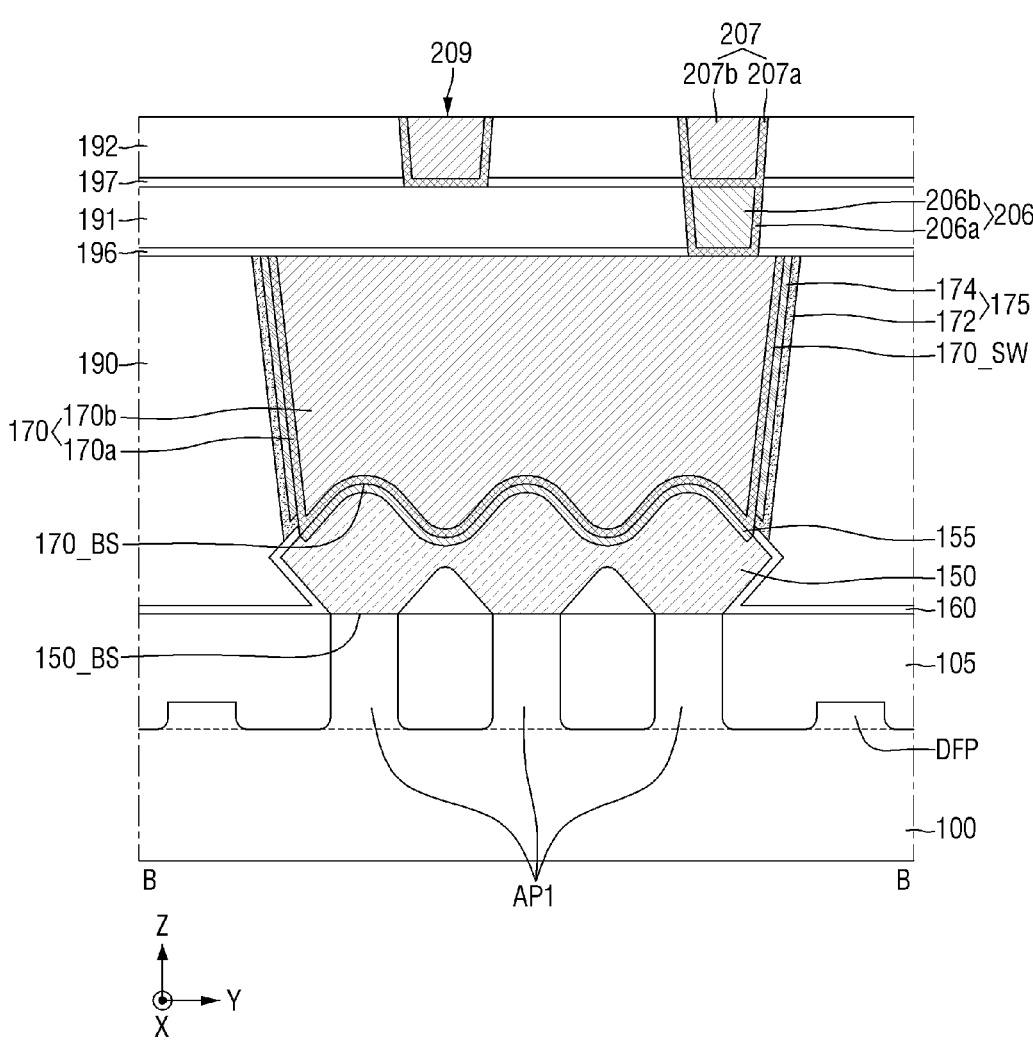
FIG. 21 is a view illustrating a semiconductor device, according to various embodiments.
Figure 22:
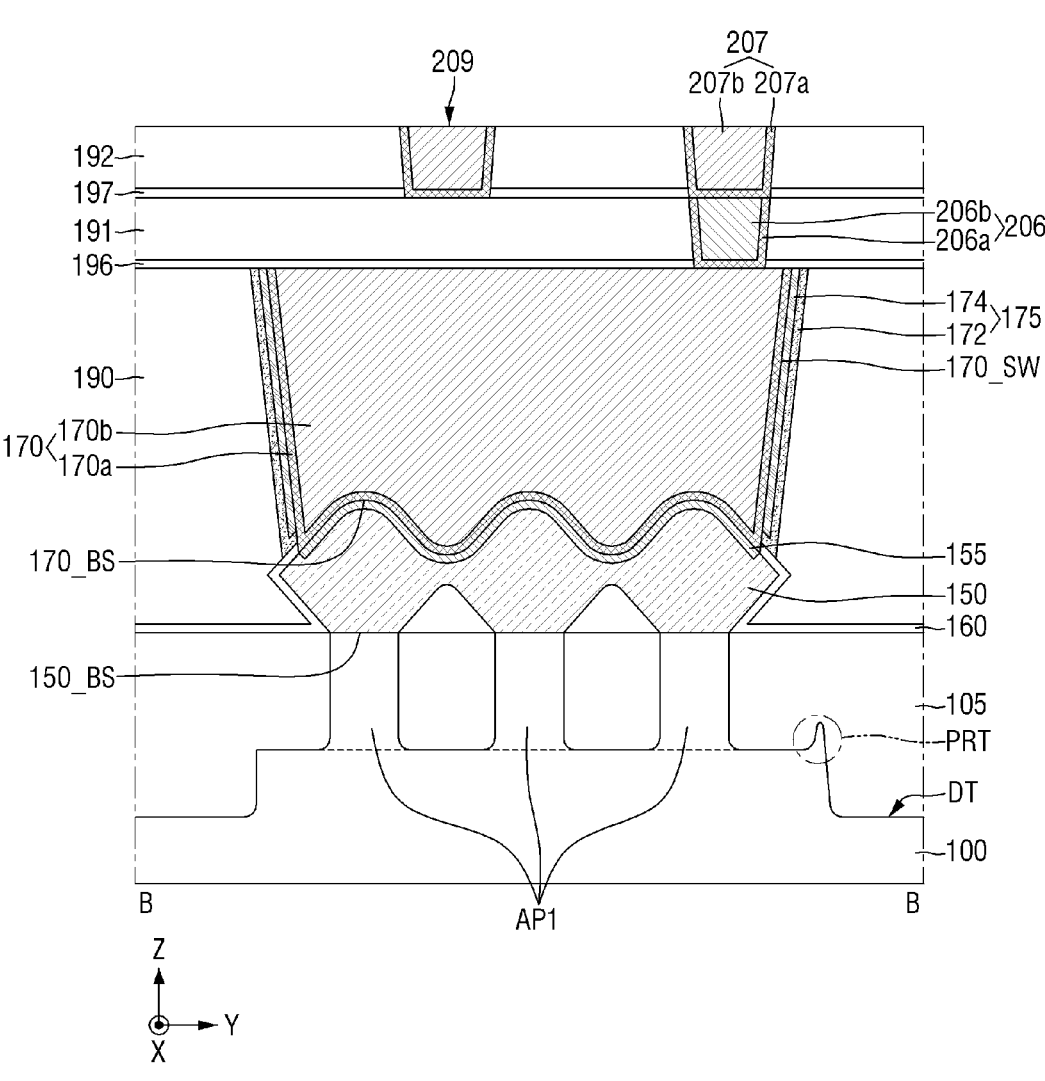
FIG. 22 is a view illustrating a semiconductor device, according to various embodiments.

FIGS. 20-22 are views illustrating a semiconductor device, according to various embodiments. For convenience of description, the following description will be based on differences from those described with reference to FIGS. 1-5.

Referring to FIG. 20, the first and second via plug 206, 208 do not include a via barrier layer.

The first and second via plug 206, 208 may have a single conductive layer structure. The first and second via plug 206, 208 may include, but is not limited to, one of tungsten (W), molybdenum (Mo), ruthenium (Ru), cobalt (Co), and titanium (Ti).

The first via plug 206 connected to the first source/drain contact 170 may be a source/drain via plug. The second via plug 208 connected to the gate contact 180 may be a gate via plug. In various embodiments, one of the source/drain via plug and the gate via plug is a single conductive layer structure, and the other one thereof may be a multi-conductive layer structure such as that shown in FIG. 2.

Referring to FIG. 21, the semiconductor device may include a dummy protruded pattern DFP formed in a field area FX.

The deep trench (DT of FIG. 4) is not formed in the field area FX. An upper surface of the dummy protruded pattern DFP is covered by the field insulating layer 105. The dummy protruded pattern DFP may include the same material as that of the at least one first active pattern AP1.

Referring to FIG. 22, the semiconductor device may further include a protruded structure PRT disposed along a boundary of the first active area RX1.

The protruded structure PRT may be disposed at the boundary of the first active area RX1 extended along the first direction X. A first sidewall of the protruded structure PRT may be defined by a fin trench that defines the at least one first active pattern AP1, and a second sidewall of the protruded structure PRT may be defined by the deep trench DT. The protruded structure PRT may be extended longitudinally in the first direction X.

The protruded structure PRT is covered by the field insulating layer 105. The protruded structure PRT may include the same semiconductor material as that of the at least one first active pattern AP1.

The protruded structure PRT is shown as being disposed along one of two boundaries of the first active area RX1 extended along the first direction X, but is not limited thereto. In various embodiments, the protruded structure PRT may be disposed along two boundaries of the first active area RX1 extended along the first direction X.

The protruded structure PRT may be disposed at an edge of the second active area RX2.

Figure 23:
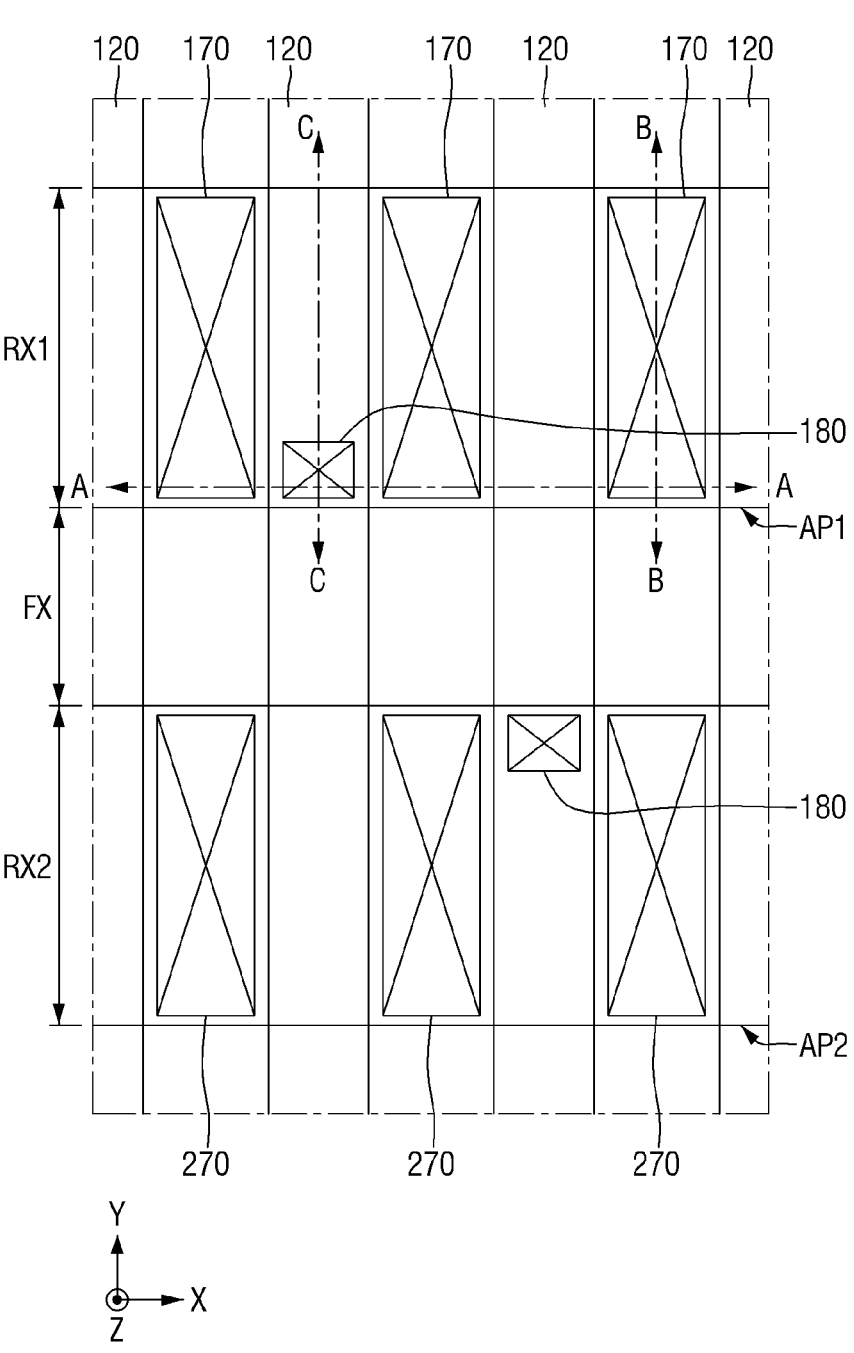
FIG. 23 is a layout view illustrating a semiconductor device, according to various embodiments.
Figure 24:
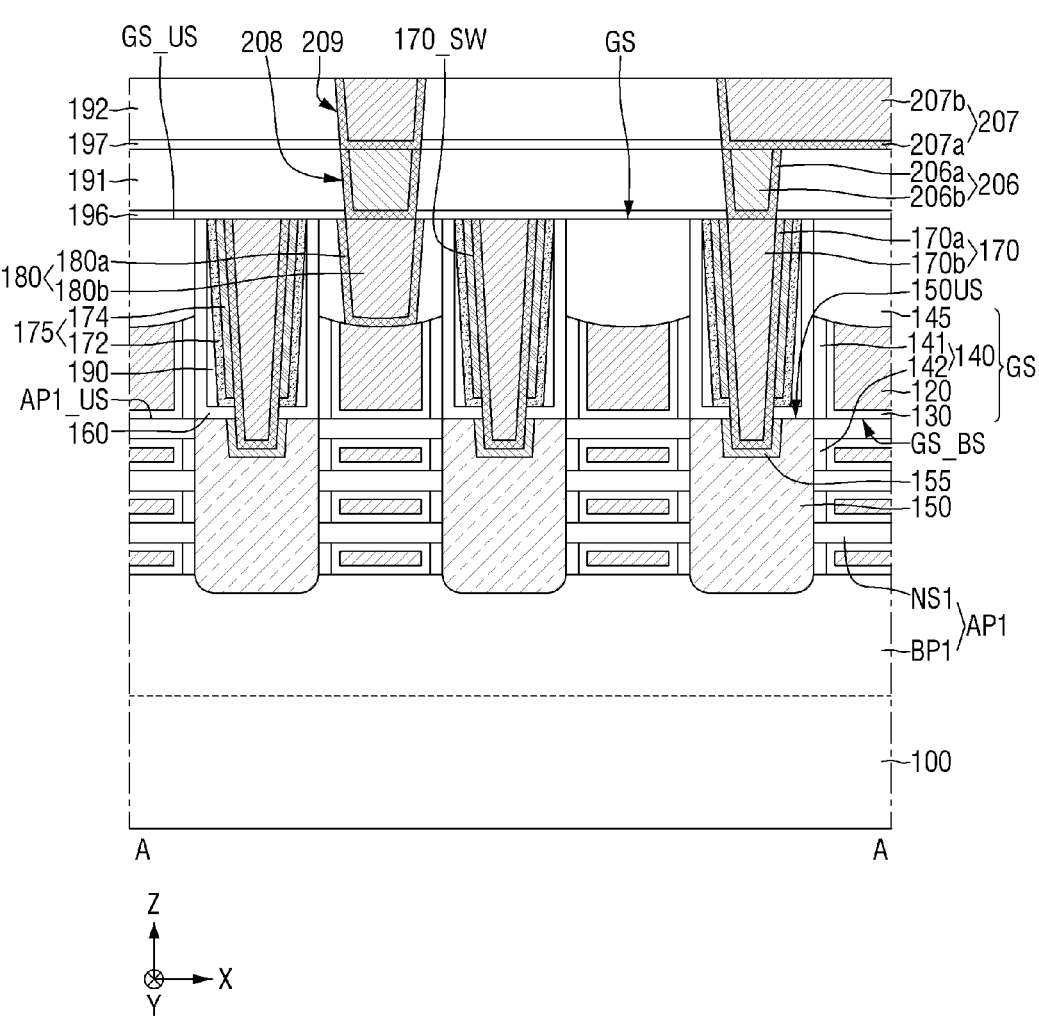
FIG. 24 is a cross-sectional view taken along line A-A of FIG. 23, according to various embodiments.
Figure 25:
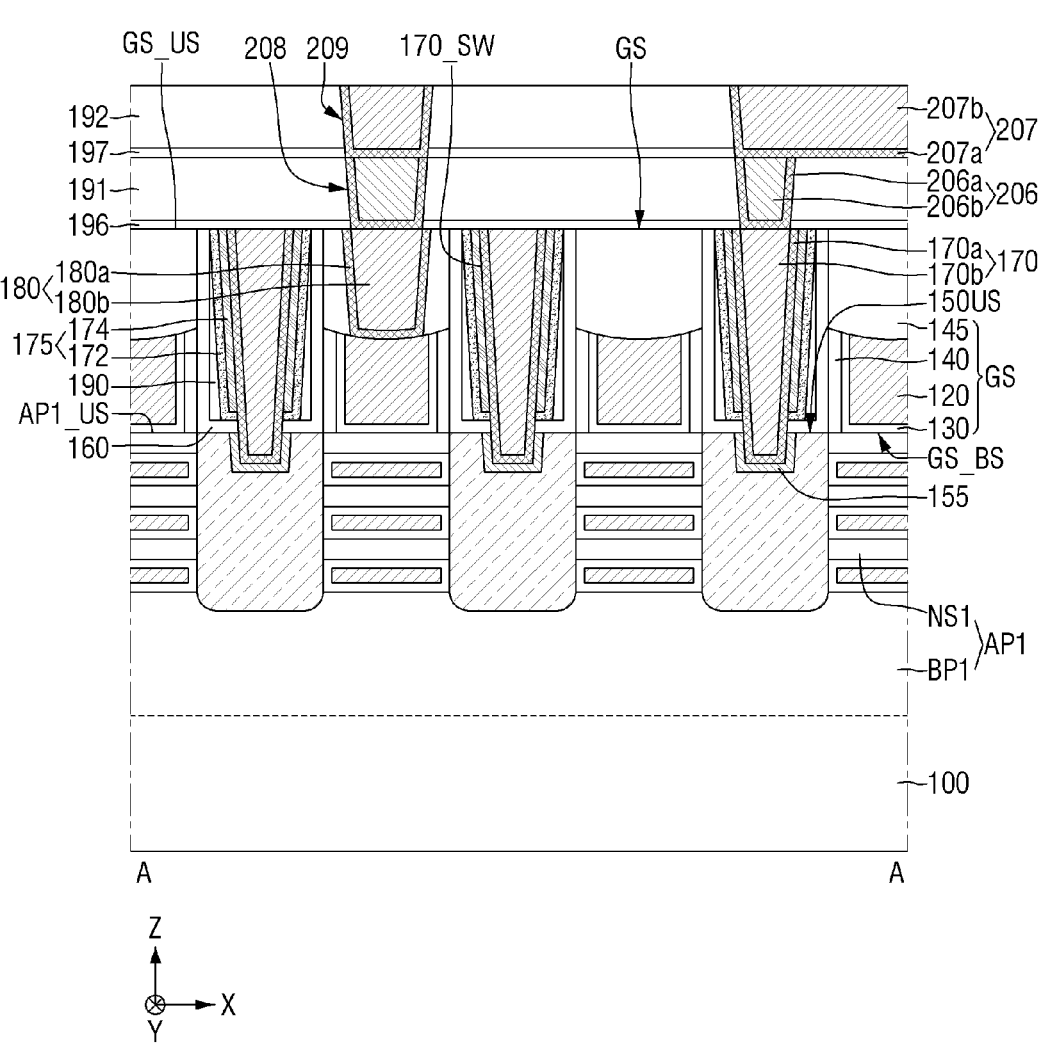
FIG. 25 is a cross-sectional view taken along line A-A of FIG. 23, according to various embodiments.
Figure 26:
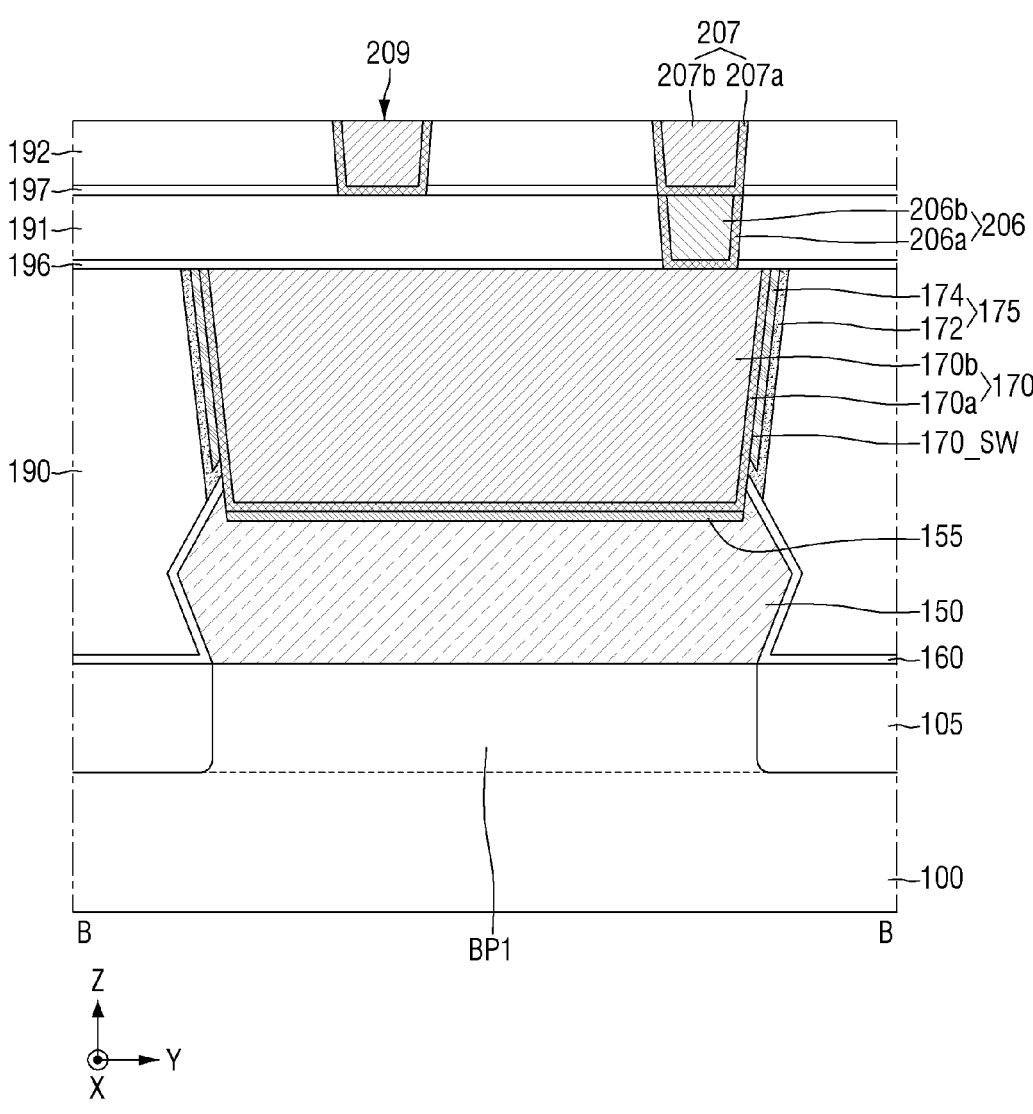
FIG. 26 is a cross-sectional view taken along line B-B of FIG. 23, according to various embodiments.
Figure 27:
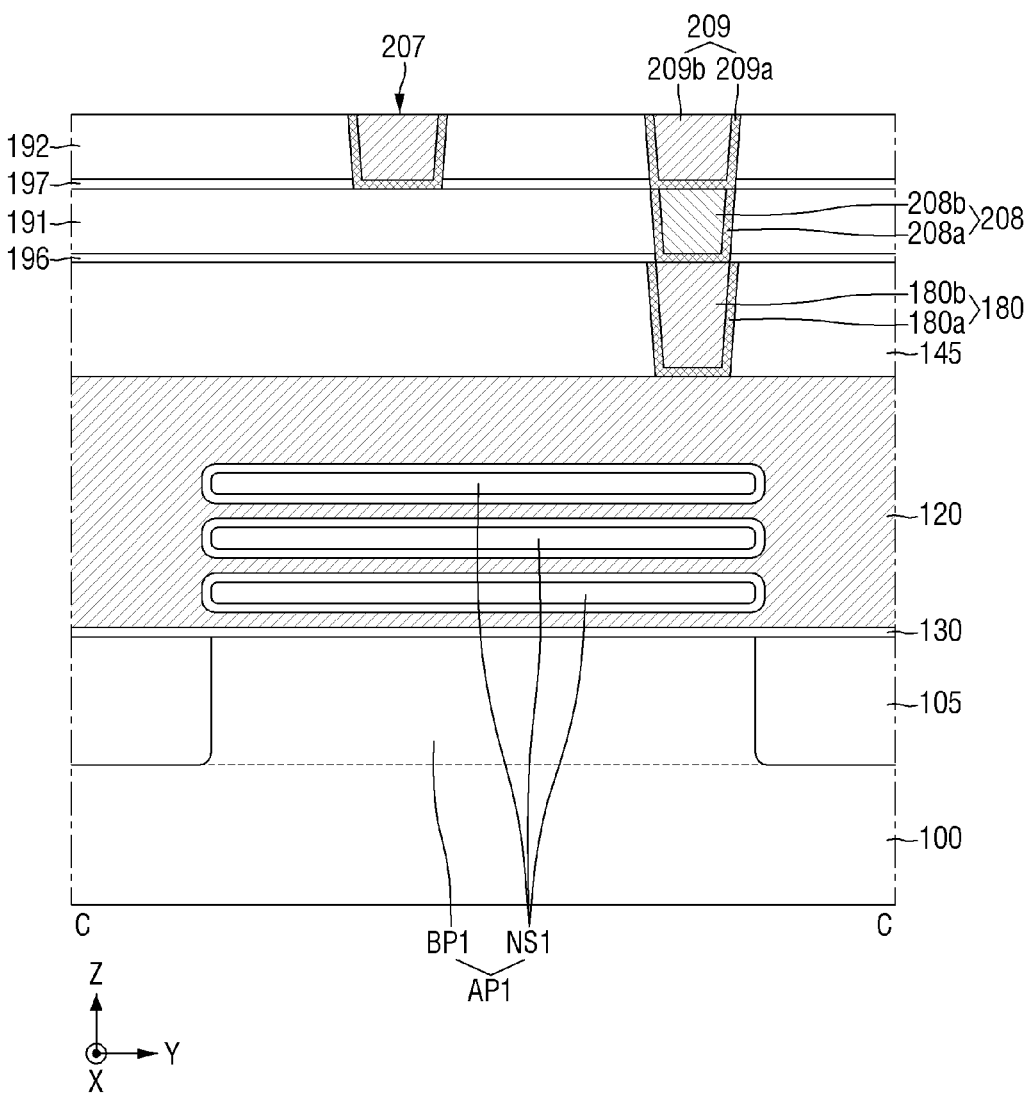
FIG. 27 is a cross-sectional view taken along line C-C of FIG. 23, according to various embodiments.

FIG. 23 is a layout view illustrating a semiconductor device, according to various embodiments. FIGS. 24 and 25 are cross-sectional views taken along line A-A of FIG. 23, according to various embodiments. FIG. 25 is a cross-sectional view taken along line A-A of FIG. 23, according to various embodiments. FIG. 26 is a cross-sectional view taken along line B-B of FIG. 23, according to various embodiments. FIG. 27 is a cross-sectional view taken along line C-C of FIG. 23, according to various embodiments. For convenience of description, the following description will be based on differences from those described with reference to FIGS. 1-5.

Referring to FIGS. 23-27, the at least one first active pattern AP1 may include a lower pattern BP1 and a sheet pattern NS1.

The at least one second active pattern AP2 may include a lower pattern and a sheet pattern.

The lower pattern BP1 may be extended along the first direction X. The sheet pattern NS1 may be disposed to be spaced apart from the lower pattern BP1 on the lower pattern BP1.

The sheet pattern NS1 may include a plurality of sheet patterns stacked in the third direction Z. Although three sheet patterns NS1 are shown for convenience of description, the number of the sheet patterns NS1 is not limited thereto. An upper surface of the sheet pattern NS1 disposed at the uppermost portion of the sheet pattern NS1 may be the upper surface AP1_US of the first active pattern.

The sheet pattern NS1 may be connected to the source/drain pattern 150. The sheet pattern NS1 may be a channel pattern used as a channel area of a transistor. For example, the sheet pattern NS1 may be a nano-sheet or a nano-wire.

The lower pattern BP1 may include, for example, silicon or germanium, which is an elemental semiconductor material. Alternatively, the lower pattern BP1 may include a compound semiconductor, and may include, for example, a group IV-IV compound semiconductor or a group III-V compound semiconductor.

The sheet pattern NS1 may include, for example, silicon or germanium, which is an elemental semiconductor material. Alternatively, the sheet pattern NS1 may comprise a compound semiconductor, and may include, for example, a group IV-IV compound semiconductor or a group III-V compound semiconductor.

The first gate insulating layer 130 may be extended along the upper surface of the lower pattern BP1 and the upper surface of the field insulating layer 105. The first gate insulating layer 130 may surround the periphery of the sheet pattern NS1.

The gate electrode 120 is disposed on the lower pattern BP1. The gate electrode 120 crosses the lower pattern BP1. The gate electrode 120 may surround the periphery of the sheet pattern NS1. The gate electrode 120 may be disposed between the lower pattern BP1 and the sheet pattern NS1 and between adjacent sheet patterns NS1.

In FIG. 24, the gate spacer 140 may include an outer spacer 141 and an inner spacer 142. The inner spacer 142 may be disposed between the lower pattern BP1 and the sheet pattern NS1 and between adjacent sheet patterns NS1.

In FIG. 25, the gate spacer 140 may include only an outer spacer 141. The inner spacer is not disposed between the lower pattern BP1 and the sheet pattern NS1 and between adjacent sheet patterns NS1.

The bottom surface of the first source/drain contact 170 may be positioned between an upper surface of the sheet pattern NS1, which is disposed at the lowermost portion, among the plurality of sheet patterns NS1 and a lower surface of the sheet pattern NS1, which is disposed at the uppermost portion, among the plurality of sheet patterns. In various embodiments, the bottom surface of the first source/drain contact 170 may be positioned between the upper surface of the sheet pattern NS1 disposed at the uppermost portion and the lower surface of the sheet pattern NS1 disposed at the uppermost portion.

The description of the contact liner structure 175 is substantially the same as that made with reference to FIGS. 1-5, and thus will be omitted.

FIGS. 28-34 are cross-sectional views taken along line A-A of FIG. 1 illustrating a method of manufacturing a semiconductor device according to various embodiments. The following manufacturing method will be described in view of a cross-sectional view.

Figure 28:
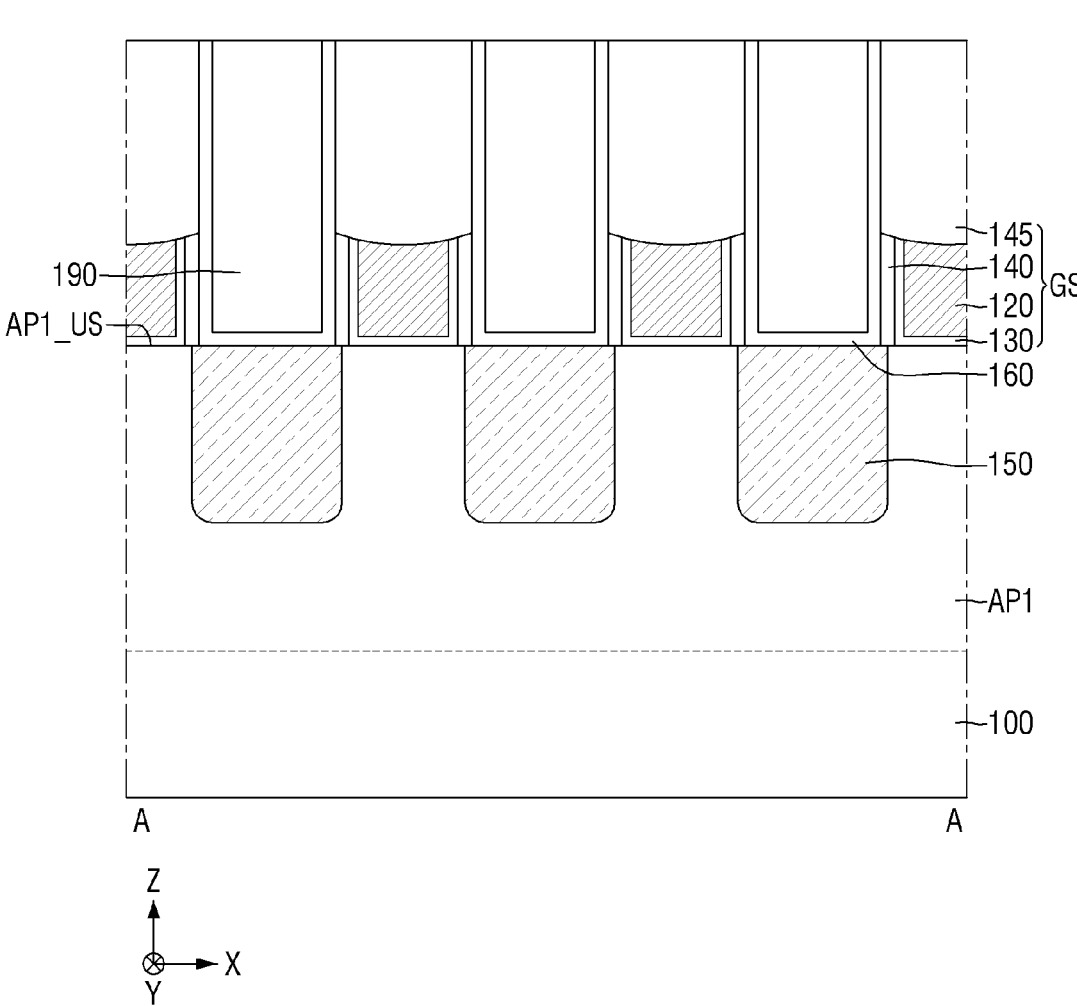
FIG. 28 is a cross-sectional view taken along line A-A of FIG. 1 illustrating a method of manufacturing a semiconductor device, according to various embodiments.

Referring to FIG. 28, the source/drain pattern 150 may be formed on the at least one first active pattern AP1.

The source/drain etch stop layer 160 and the first inter-layer insulating layer 190 are sequentially formed on the source/drain pattern 150.

After the first interlayer insulating layer 190 is formed, the gate structure GS may be formed through a replacement metal gate (RMG) process.

Figure 29:
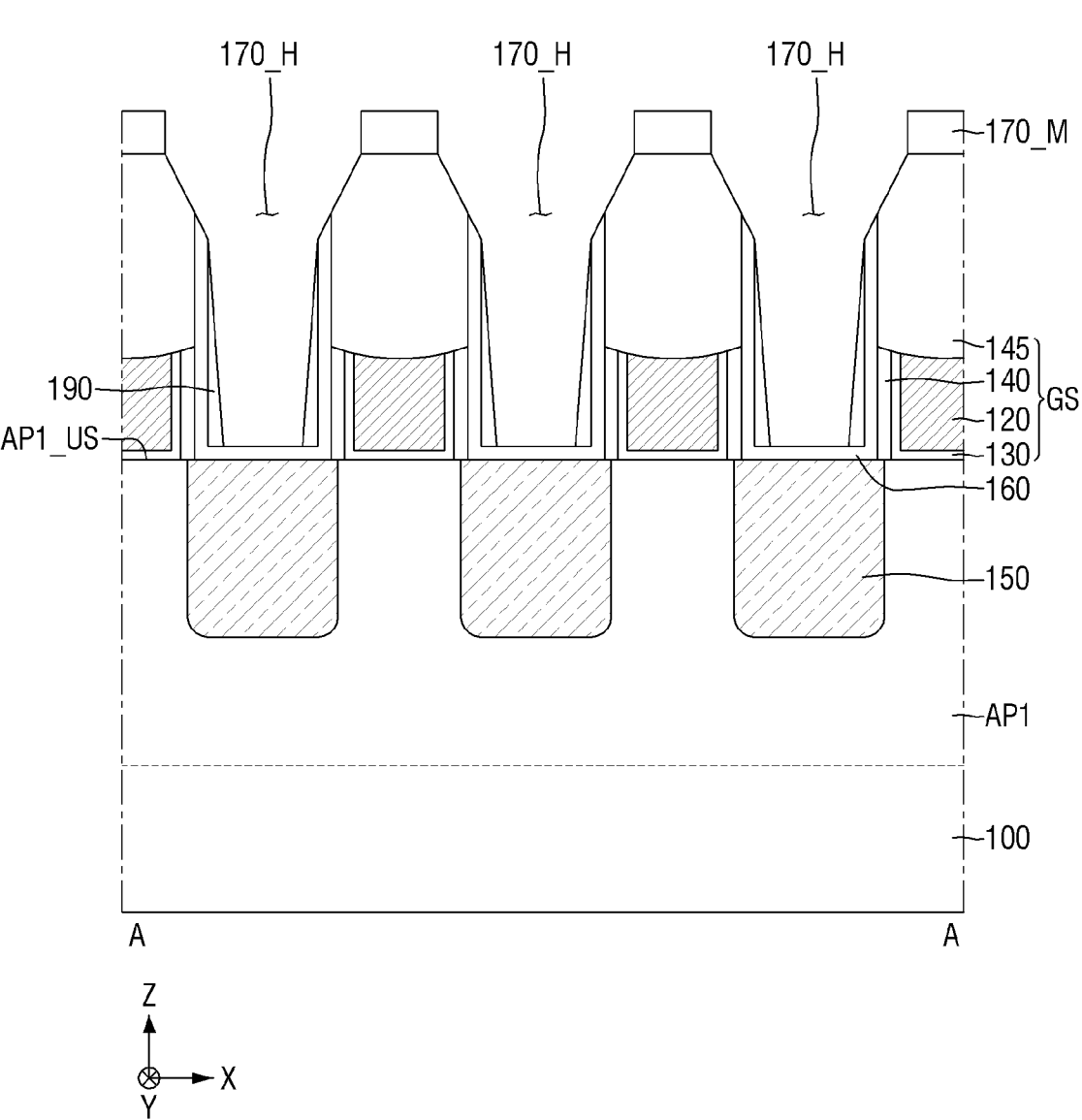
FIG. 29 is a cross-sectional view taken along line A-A of FIG. 1 illustrating a method of manufacturing a semiconductor device, according to various embodiments.

Referring to FIG. 29, a contact hole 170_H may be formed in the first interlayer insulating layer 190.

In more detail, a mask buffer layer may be formed on the gate structure GS. A mask pattern may be formed on the mask buffer layer. The mask buffer layer may include, for example, an oxide, but is not limited thereto.

The contact hole 170_H may be formed in the first interlayer insulating layer 190 by using the mask pattern as a mask. A mask buffer layer may be patterned in the process of forming the contact hole 170_H. As the mask buffer layer is patterned, the mask buffer pattern 170_M may be formed on the gate structure GS.

The contact hole 170_H may expose the source/drain etch stop layer 160. For example, the contact hole 170_H may not pass through the source/drain etch stop layer 160 while the mask buffer pattern 170_M is being formed. A bottom surface of the contact hole 170_H may be defined by the source/drain etch stop layer 160.

In various embodiments, the contact hole 170_H formed as the mask buffer pattern 170_M is formed may pass through the source/drain etch stop layer 160. In this case, the source/drain pattern 150 may be exposed by the contact hole 170_H.

Figure 30:
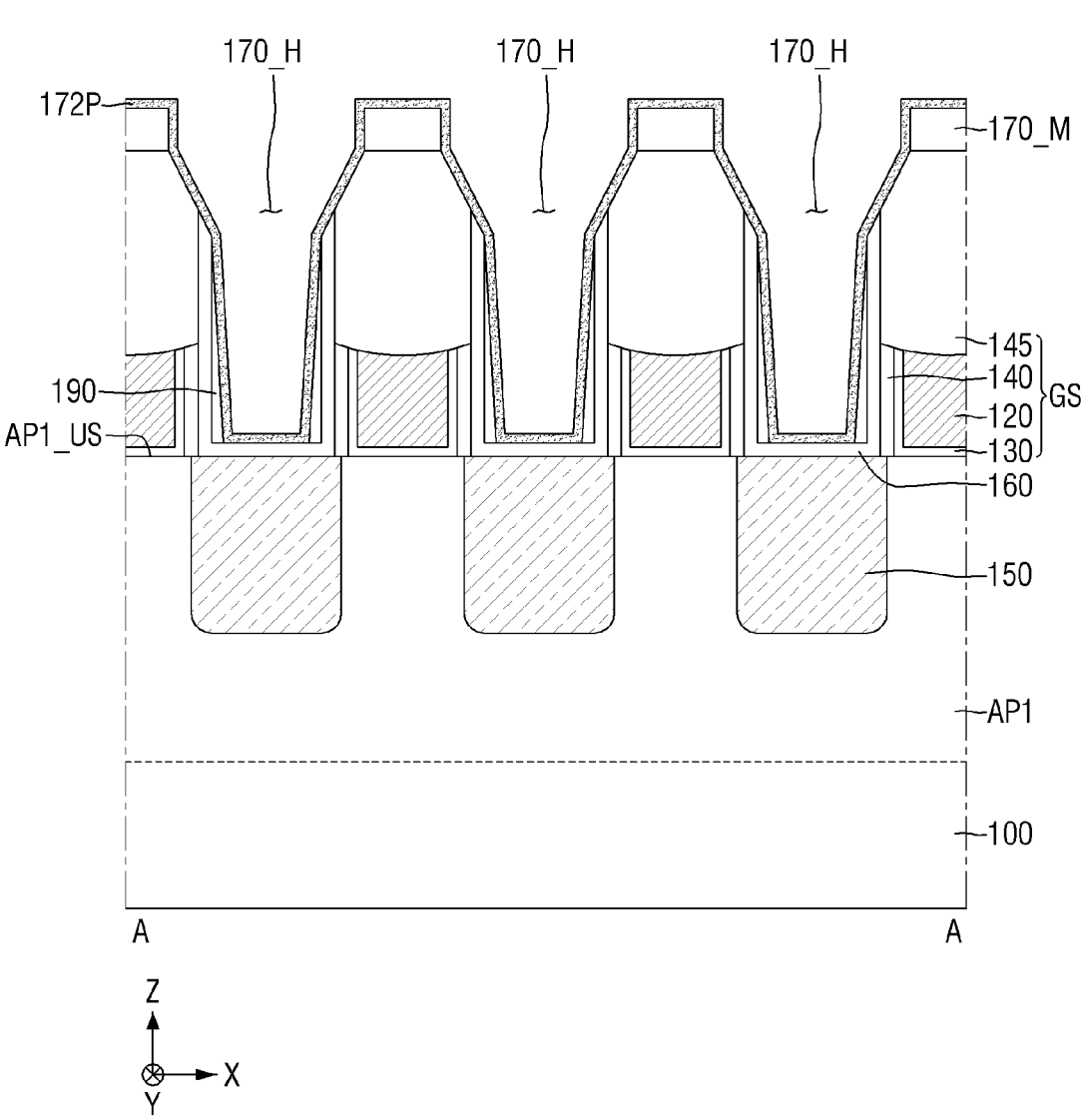
FIG. 30 is a cross-sectional view taken along line A-A of FIG. 1 illustrating a method of manufacturing a semiconductor device, according to various embodiments.

Referring to FIG. 30, a first pre-contact liner layer 172P may be formed along a sidewall and the bottom surface of the contact hole 170_H.

The first pre-contact liner layer 172P may be formed along the upper surface of the mask buffer pattern 170_M. The first pre-contact liner layer 172P may be formed using, for example, a chemical vapor deposition (CVD) method.

As the first pre-contact liner layer 172P extends away from the upper surface AP1_US of the first active pattern, a concentration of carbon contained in the first pre-contact liner layer 172P extended along the sidewall of the contact hole 170_H may be increased.

Figure 31:
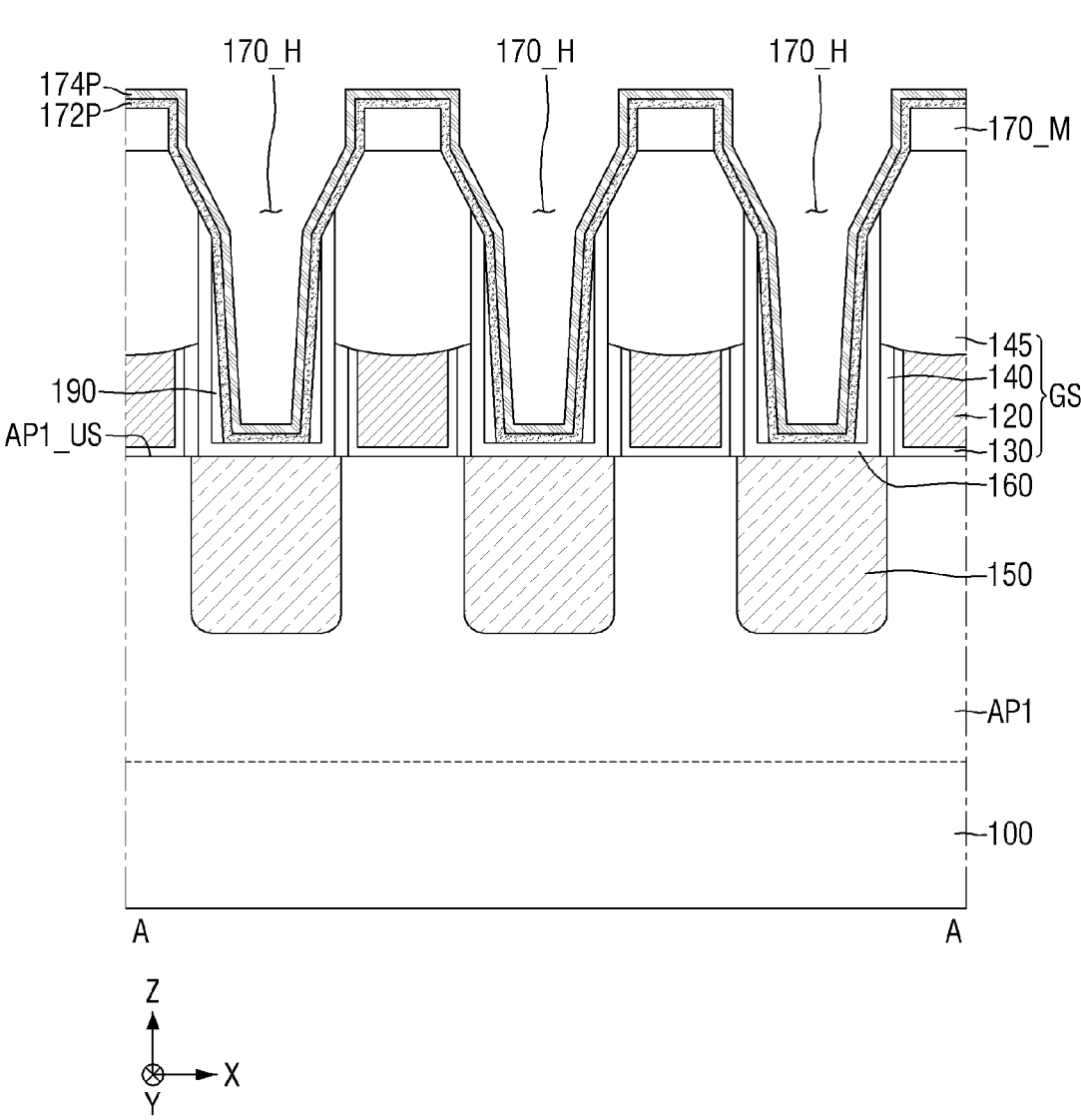
FIG. 31 is a cross-sectional view taken along line A-A of FIG. 1 illustrating a method of manufacturing a semiconductor device, according to various embodiments.

Referring to FIG. 31, a second pre-contact liner layer 174P may be formed along the first pre-contact liner layer 172P.

In the same manner as the first pre-contact liner layer 172P, as the second pre-contact liner layer 174P extends away from the upper surface AP1_US of the first active pattern, a concentration of carbon contained in the second pre-contact liner layer 174P may be increased.

Figure 32:
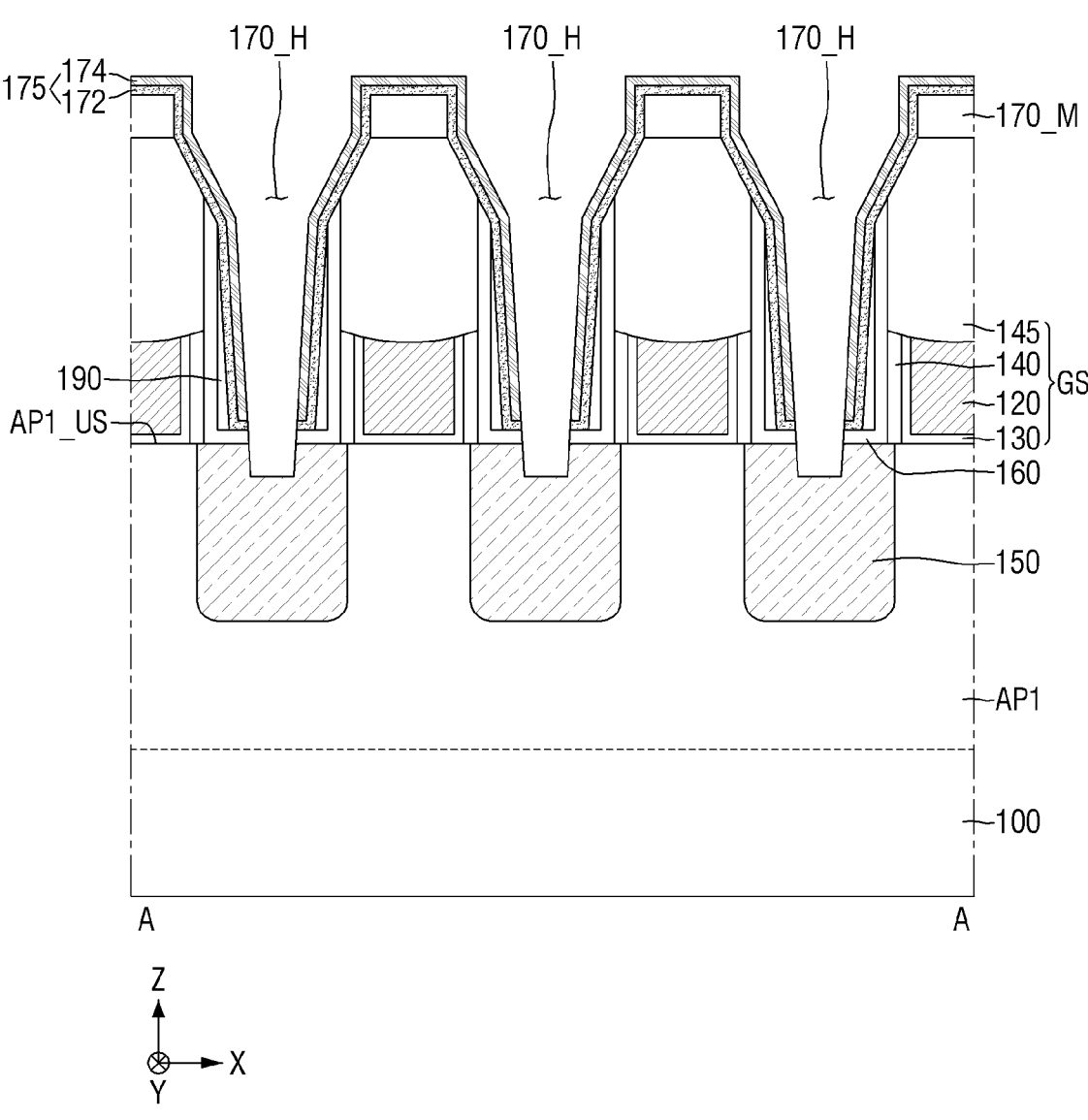
FIG. 32 is a cross-sectional view taken along line A-A of FIG. 1 illustrating a method of manufacturing a semiconductor device, according to various embodiments.

Referring to FIGS. 31 and 32, a portion of the first pre-contact liner layer 172P and the second pre-contact liner layer 174P may be etched to form the contact liner structure 175 on the sidewall of the contact hole 170_H.

The pre-contact liner layer 175P on the bottom surface of the contact hole 170_H may be removed using directional etching. As a result, the contact liner structure 175 may be formed.

After the first pre-contact liner layer 172P and the second pre-contact liner layer 174P on the bottom surface of the contact hole 170_H are removed, the source/drain etch stop layer 160 may be also removed. A portion of the source/drain etch stop layer 160 may be removed, so that the contact hole 170_H may pass through the source/drain etch stop layer 160.

The contact hole 170_H may expose the source/drain pattern 150 while the contact liner structure 175 is being formed. The contact hole 170_H is extended to the source/drain pattern 150.

A portion of the source/drain pattern 150 may be etched while the contact liner structure 175 is being formed. A portion of the sidewall of the contact hole 170_H may be defined by the source/drain pattern 150. In various embodiments, the source/drain pattern 150 may not be etched while the contact liner structure 175 is being formed.

Figure 33:
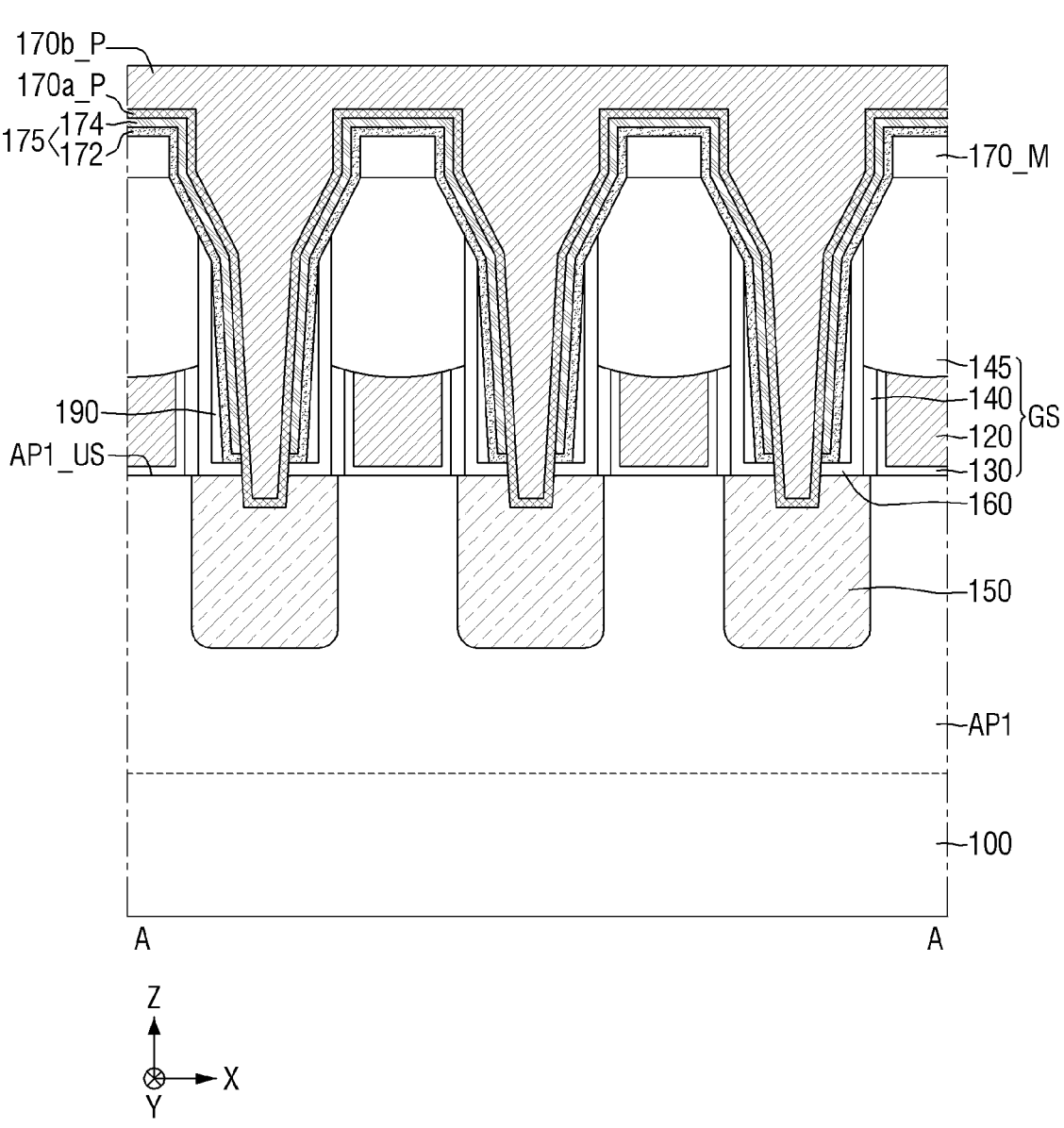
FIG. 33 is a cross-sectional view taken along line A-A of FIG. 1 illustrating a method of manufacturing a semiconductor device, according to various embodiments.

Referring to FIG. 33, a pre-barrier layer 170a_P is formed along the sidewall and the bottom surface of the contact hole 170_H.

The pre-barrier layer 170a_P is formed on the contact liner structure 175 formed along the sidewall of the contact hole 170_H.

A pre-filling layer 170b_P is formed on the pre-barrier layer 170a_P. The pre-filling layer 170b_P may fill the contact hole 170_H.

For example, before the pre-barrier layer 170a_P is formed, the contact silicide layer 155 may be formed on the source/drain pattern 150. As another example, the contact silicide layer 155 may be formed on the source/drain pattern 150 through a heat treatment process while the pre-barrier layer 170a_P is formed. As another example, after the pre-filling layer 170b_P is formed, the contact silicide layer 155 may be formed on the source/drain pattern 150 through a heat treatment process.

Figure 34:
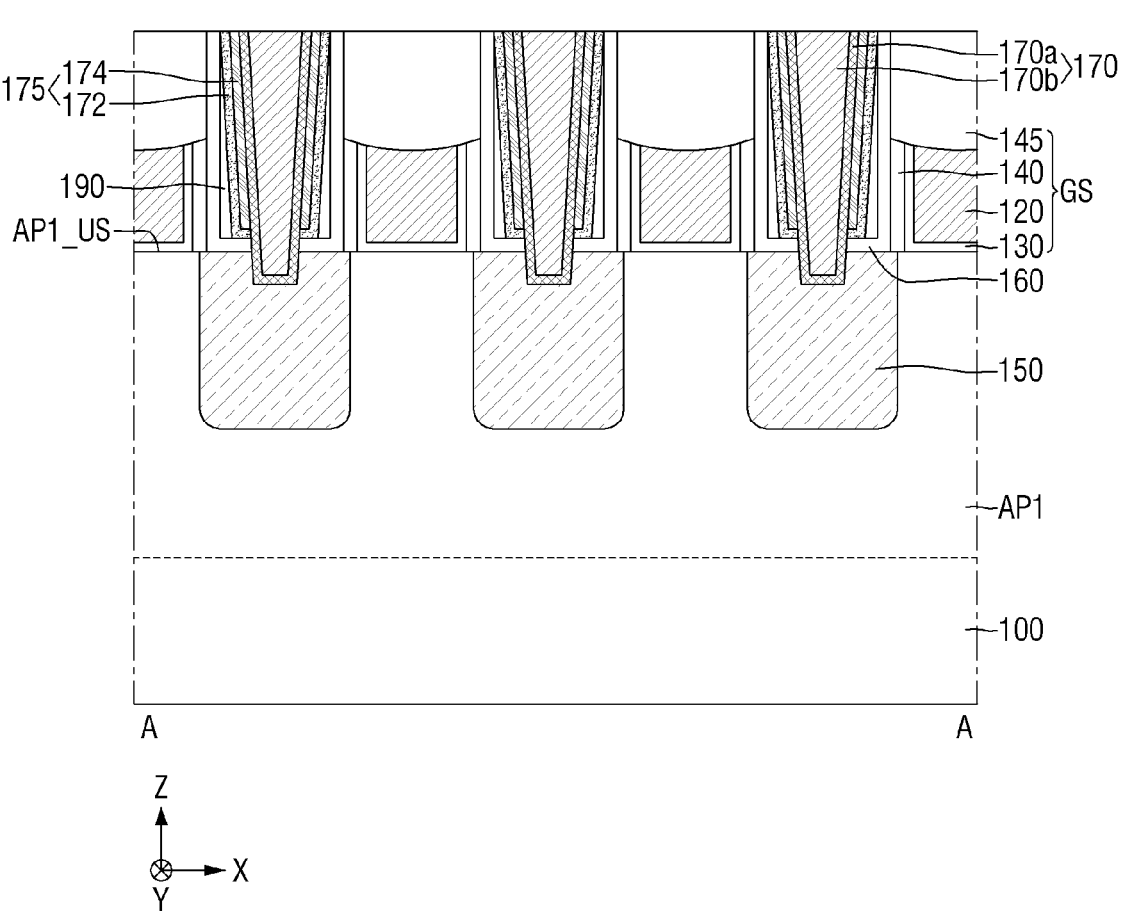
FIG. 34 is a cross-sectional view taken along line A-A of FIG. 1 illustrating a method of manufacturing a semiconductor device, according to various embodiments.

Referring to FIGS. 33 and 34, the first source/drain contact 170 filling the contact hole 170_H may be formed on the contact liner structure 175.

The first source/drain contact 170 is formed on the source/drain pattern 150. The first source/drain contact 170 is connected to the source/drain pattern 150.

In more detail, a portion of the pre-barrier layer 170a_P and a portion of the pre-filling layer 170b_P may be removed to form the first source/drain contact 170. The mask buffer pattern 170_M may be removed while the first source/drain contact 170 is being formed. Also, a portion of the gate capping layer 145 may be removed while the first source/drain contact 170 is being formed.

Referring to FIG. 2, the gate contact 180 may be formed on the gate electrode 120. The first and second via plug 206, 208 may be formed on the first source/drain contact 170 and the gate contact 180, respectively. The first and second wiring line 207, 209 may be formed on the first source/drain contact 170 and the gate contact 180, respectively.

In various embodiments, a process of forming the first source/drain contact 170 may be performed after the gate contact 180 is formed.

In concluding the detailed description, those skilled in the art will appreciate that many variations and modifications may be made to the various embodiments without substantially departing from the principles of the present disclosure. Therefore, the various embodiments of the disclosure are used in a generic and descriptive sense only and not for purposes of limitation.

What is claimed is:

1. A semiconductor device comprising:
an active pattern extended in a first direction;
a plurality of gate structures comprising a gate electrode and a gate spacer, which are disposed to be spaced apart from each other in the first direction on the active pattern and extended in a second direction;
a source/drain pattern on the active pattern;
a source/drain contact on the source/drain pattern; and a contact liner structure extended along a sidewall of the source/drain contact, being in contact with the sidewall of the source/drain contact, wherein the contact liner structure comprises a first contact liner and a second contact liner on the first contact liner, wherein the first contact liner comprises a first bottom portion, and a first vertical portion protruded from the first bottom portion and extended in a third direction, wherein a lower surface of the contact liner structure is spaced apart from level of an upper surface of the source/drain pattern, and wherein the sidewall of the source/drain contact extends downwardly beyond the first bottom portion of the first contact liner and a lower end portion of the second contact liner.

2. The semiconductor device of claim 1, wherein the second contact liner comprises a material having a dielectric constant smaller than that of the first contact liner.

3. The semiconductor device of claim 1, wherein the second contact liner comprises carbon, and wherein a concentration of carbon contained in the second contact liner at a first height in the third direction is higher than a concentration of carbon contained in the second contact liner at a second height lower than the first height.

4. The semiconductor device of claim 1, wherein the second contact liner comprises:

a second bottom portion on the first bottom portion; and a second vertical portion protruded from the second bottom portion and extended in the third direction.

5. The semiconductor device of claim 1, further comprising an etch stop layer extended along a sidewall of the plurality of gate structures and the upper surface of the source/drain pattern, wherein the etch stop layer is in contact with the first vertical portion at a first height in the third direction, and wherein an interlayer insulating layer is disposed between the etch stop layer and the first vertical portion at a second height lower than the first height in the third direction.

6. The semiconductor device of claim 5, wherein the plurality of gate structures further include a gate capping layer on the gate electrode and the gate spacer, wherein the etch stop layer is in contact with the gate capping layer at the first height, and wherein the etch stop layer is in contact with the gate spacer at the second height.

7. The semiconductor device of claim 5, wherein a first width of the etch stop layer at the first height in the first direction is smaller than a second width of the etch stop layer at the second height in the first direction.

8. The semiconductor device of claim 1, wherein the active pattern comprises a lower pattern, and a plurality of sheet patterns spaced apart from the lower pattern in the third direction, and wherein the gate electrode surrounds the plurality of sheet patterns.

9. The semiconductor device of claim 1, wherein the upper surface of the source/drain pattern in the third direction is higher than a level of a lower surface of the plurality of gate structures.

10. The semiconductor device of claim 1, wherein the second contact liner has a width that is increased as the second contact liner extends away from the upper surface of the source/drain pattern in the third direction.

11. The semiconductor device of claim 1, further comprising a contact silicide layer between the source/drain pattern and the source/drain contact.

12. A semiconductor device comprising:

an active pattern extended in a first direction;

a plurality of gate structures comprising a gate electrode and a gate spacer, which are disposed to be spaced apart from each other in the first direction on the active pattern and extended in a second direction, and a gate capping layer on the gate electrode and the gate spacer;

a source/drain pattern on the active pattern;

an etch stop layer extended along a sidewall of the plurality of gate structures and an upper surface of the source/drain pattern;

a source/drain contact on the source/drain pattern; and a contact liner structure extended along a sidewall of the source/drain contact on the etch stop layer, wherein the contact liner structure comprises a first contact liner, and a second contact liner extended along the first contact liner and disposed between the first contact liner and the source/drain contact, wherein the etch stop layer is in contact with a sidewall of the first contact liner at a first height in a third direction perpendicular to the first direction and the second direction, wherein an interlayer insulating layer is disposed between the etch stop layer and the sidewall of the first contact liner at a second height lower than the first height, and wherein the sidewall of the source/drain contact extends downwardly beyond a bottom portion of the first contact liner and a lower end portion of the second contact liner.

13. The semiconductor device of claim 12, wherein the first height in the third direction is greater than a height from a lower surface of the plurality of gate structures to a point where the gate capping layer and the etch stop layer meet.

14. The semiconductor device of claim 12, wherein the etch stop layer at the first height is in contact with the gate capping layer, and the etch stop layer at the second height is in contact with the gate spacer.

15. The semiconductor device of claim 12, wherein a first width of the etch stop layer at the first height in the first direction is smaller than a second width of the etch stop layer at the second height in the first direction.

16. The semiconductor device of claim 12, wherein the second contact liner comprises a material having a dielectric constant lower than that of the first contact liner.

17. The semiconductor device of claim 12, wherein the second contact liner comprises carbon, and a concentration of carbon contained in the second contact liner increases as the second contact liner extends away from the upper surface of the source/drain pattern in the third direction.

18. The semiconductor device of claim 12, wherein the first contact liner comprises:

a first bottom portion that is in contact with a bottom surface of the etch stop layer; and a first vertical portion protruded from the first bottom portion and extended in the third direction.

19. The semiconductor device of claim 12, wherein a width of the second contact liner is increased as the second contact liner extends away from the upper surface of the source/drain pattern.

20. A semiconductor device comprising:

an active pattern comprising a lower pattern extended in a first direction and a plurality of sheet patterns spaced apart from the lower pattern in a second direction perpendicular to the first direction;

a plurality of gate structures comprising a gate electrode and a gate spacer, which are disposed to be spaced apart from each other in the first direction on the active pattern and extended in a third direction crossing the first direction and the second direction;

a source/drain pattern on the active pattern;

a source/drain contact on the source/drain pattern;

an etch stop layer extended along a sidewall of the plurality of gate structures and an upper surface of the source/drain pattern; and a contact liner structure extended along a sidewall of the source/drain contact on the etch stop layer, wherein the contact liner structure comprises a first contact liner and a second contact liner on the first contact liner, wherein the first contact liner comprises a first bottom portion, and a first vertical portion protruded from the first bottom portion and extended in the second direction, wherein the etch stop layer is in contact with the first vertical portion at a first height in the second direction, wherein an interlayer insulating layer is disposed between the etch stop layer and the first vertical portion at a second height lower than the first height, and wherein the sidewall of the source/drain contact extends downwardly beyond the first bottom portion of the first contact liner and a lower end portion of the second contact liner.

\*   \*   \*   \*   \*